US010327086B2

(12) United States Patent
Orth et al.

(10) Patent No.: US 10,327,086 B2
(45) Date of Patent: Jun. 18, 2019

(54) HEAD RELATED TRANSFER FUNCTION EQUALIZATION AND TRANSDUCER AIMING OF STEREO DIMENSIONAL ARRAY (SDA) LOUDSPEAKERS

(71) Applicant: POLK AUDIO, LLC, Vista, CA (US)

(72) Inventors: Scott Orth, Baltimore, MD (US); Stuart W. Lumsden, Baltimore, MD (US)

(73) Assignee: POLK AUDIO, LLC, Vista, CA (US)

( * ) Notice: Subject to any disclaimer, the term of this patent is extended or adjusted under 35 U.S.C. 154(b) by 0 days.

(21) Appl. No.: 15/965,713

(22) Filed: Apr. 27, 2018

(65) Prior Publication Data

US 2018/0317034 A1 Nov. 1, 2018

Related U.S. Application Data

(60) Provisional application No. 62/491,009, filed on Apr. 27, 2017.

(51) Int. Cl.

| | |
|---|---|
| ***H03G 5/00*** | (2006.01) |
| ***H04S 1/00*** | (2006.01) |
| ***H04R 5/04*** | (2006.01) |
| ***H04R 3/04*** | (2006.01) |
| ***H04R 5/02*** | (2006.01) |
| ***H04R 3/14*** | (2006.01) |
| *H04S 3/00* | (2006.01) |

(52) U.S. Cl.

CPC ............... *H04S 1/002* (2013.01); *H04R 3/04* (2013.01); *H04R 3/14* (2013.01); *H04R 5/02* (2013.01); *H04R 5/04* (2013.01); *H04S 3/00* (2013.01); *H04S 3/002* (2013.01); *H04S 2400/09* (2013.01); *H04S 2420/01* (2013.01)

(58) Field of Classification Search

CPC .. H04S 1/002; H04S 2400/09; H04S 2420/01; H04S 3/002; H04S 3/00; H04R 3/04; H04R 3/14; H04R 5/02; H04R 5/04

See application file for complete search history.

(56) References Cited

U.S. PATENT DOCUMENTS

| | | | | | |
|---|---|---|---|---|---|
| 4,489,432 A | * | 12/1984 | Polk | H04S 3/00 381/1 |
| 4,638,505 A | * | 1/1987 | Polk | H04S 3/00 381/300 |
| 4,759,066 A | * | 7/1988 | Polk | H04S 1/002 381/302 |
| 5,553,149 A | * | 9/1996 | Freadman | H04R 5/02 181/147 |

* cited by examiner

*Primary Examiner* — Andrew L Sniezek

(74) *Attorney, Agent, or Firm* — McKinney & Associates, LLC; J. Andrew McKinney, Jr.

(57) ABSTRACT

An enhanced Stereo Dimensional Array loudspeaker system 250 preferably including a mirror image pair of loudspeaker enclosures 280L, 280R configurable by a user or installer as a left-channel loudspeaker and a right channel loudspeaker each having a driver array aiming configuration with first and second angled baffle facets carrying main and effects drivers on separate facets and a Head Shadow filter signal processing system and method for driving the main and effects drivers to achieve a psycho-acoustically expanded image breadth by Head Shadow filter compensated inter-aural crosstalk cancellation.

15 Claims, 18 Drawing Sheets

AMPLIFIER-SPEAKER CONNECTIONS AND INTERCONNECT CABLE

SDA WITHOUT HEAD SHADOW FILTER

ACOUSTIC SUMS $$L_{ear} = L_{Main} * HRTF_{+30} + L_{SDA} * HRTF_{+30} * \Delta_1 + R_{SDA} * HRTF_{-30} * \Delta_2$$

$$R_{ear} = L_{Main} * HRTF_{-30} * \Delta_3 + L_{SDA} * HRTF_{-30} * \Delta_2 + R_{SDA} * HRTF_{+30} * \Delta_1$$

| | ST-TW+ | ST-TW- | ST-MD+ | ST-MD- | SDA-TW+ | SDA-TW- | SDA-MD+ | SDA-MD- |
|---|---|---|---|---|---|---|---|---|
| Speaker Left | RTW+ | RTW- | RMD+ | RMD- | LTW+ | LTW- | LMD+ | LMD- |
| Speaker Right | LTW+ | LTW- | LMD+ | LMD- | RTW+ | RTW- | RMD+ | RMD- |

SECTION AD-AD

SECTION B-B

HEAD RELATED TRANSFER FUNCTION EQUALIZATION AND TRANSDUCER AIMING OF STEREO DIMENSIONAL ARRAY (SDA) LOUDSPEAKERS

PRIORITY CLAIM AND REFERENCE TO RELATED APPLICATIONS

This application claims priority to related and commonly owned U.S. provisional patent application No. 62/491,009, filed Apr. 27, 2017, the entire disclosure of which is incorporated herein by reference. The subject matter of this invention is also related to the following commonly owned Stereo/Dimensional Array® ("SDA®") patents: (a) U.S. Pat. No. 4,489,432, (b) U.S. Pat. No. 4,497,064, (c) U.S. Pat. No. 4,569,074, (d) U.S. Pat. No. 6,937,737, and (e) U.S. Pat. No. 7,231,053, the entireties of which are incorporated herein by reference, for purposes of providing background information and nomenclature.

BACKGROUND OF THE INVENTION

Field of the Invention

The present invention relates to reproduction of sound in audio playback systems generically known as "stereo" systems and more specifically to the application of psychoacoustic and acoustic principles in the design of a multi-driver loudspeaker system configured for use in a stereo pair, traditionally located in front of a listening space.

Discussion of the Prior Art

Recorded music consumers or listeners often use two-channel "stereo" systems when listening to music recordings. Most commercial recorded music is provided via online music streaming or download services or via distribution of physical recording products such as Compact Discs ("CD"s) which provide listeners with two-channel or stereo recordings. In the parlance of stereo recording and playback, a sound which seems to come from the central space between a left and right speaker (e.g., a single frequency tone having equal amplitude in both left and right channels) is said to be "centered" in the "stereo image" as perceived by the listener. Music recording producers have become very adept at producing wonderful stereo recordings which (when played back under ideal conditions) seem to place performer's instruments in a space which is recreated or synthesized in front of the listener during music playback. Very few listeners were treated to this ideal playback (with palpable, stable sonic images) however, which is why Mathew Polk developed the original Stereo/Dimensional Array® loudspeaker systems such as those illustrated in FIGS. 1A-1D.

Matthew Polk's "SDA" Patents:

Generating a broad and stable acoustic image was the desired goal of Polk Audio's work as described and illustrated in the commonly owned (and now expired) U.S. Pat. Nos. 4,489,432, 4,497,064 and 4,569,074, among. others. FIG. 1A is a diagram taken from U.S. Pat. No. 4,497,064 illustrating Polk's "SDA" loudspeaker system and method, with a stereo pair of "main" left and right channel speakers (LMS, RMS) each placed beside a corresponding "sub" or SDA dimensional effect speakers (LSS, RSS), where all four speakers are aligned along a speaker axis in front of a listening location.

Referring to FIGS. 1A-1D, an SDA™ stereophonic sound reproduction system 50 includes an amplifier 54 having a left channel output ("L") 60 and a right channel output ("R") 70, each with positive and negative connections. Right loudspeaker system 80R includes a right main speaker (RMS or, as seen in FIG. 1B, stereo mid-woofer) and Left loudspeaker system 80L includes a left main speaker driver (LMS or stereo mid-woofer) at right and left main speaker locations which are equidistantly spaced from the listening location. The listening location (shown in the diagram of FIG. 1A centered in a listener's head) is defined as a spatial position for accommodating a listener facing the main speakers and having a right ear location $R_e$ and a left ear location $L_e$ which are aligned along an ear axis, with the right and left ear locations separated along the ear axis by a maximum interaural sound distance of $\Delta t_{max}$ and the listening location being defined as the point on the ear axis equidistant to the right and left ears. Polk Audio's SDA speaker system model SDA1 is shown in FIGS. 1B, 1C and 1D, and these are exemplary of many other Polk Audio speaker systems made using the SDA™ technology. Right dimensional effect or sub-speaker (RSS or, as seen in FIG. 1B, dimensional mid-woofer) and left dimensional effect or sub-speaker (LSS or dimensional mid-woofer) are provided at right and left sub-effect speaker locations which are equidistantly spaced from the listening location, in the listener's space or room (as best seen in FIG. 1A and FIG. 1D). The right and left channel outputs from Amplifier 54 (FIG. 1C) are coupled respectively to the right and left main speakers (RMS, LMS). The crossover networks of right speaker 80R and left speaker 80L are connected and an inverted right channel signal ("−R") with the low frequency components attenuated is developed and coupled to the left dimensional effect or sub-speaker (LSS) via an SDA interconnect cable 66. And an inverted left channel signal ("−L") with the low frequency components attenuated is developed and coupled to the right dimensional effect or sub-speaker (RSS) via SDA interconnect cable 66.

The distance between the main speakers and sub-speakers (W) was then selected (as a function of $\Delta t_{max}$) to render an expanded acoustic image with no reduction of low frequency response as perceived by a listener located at the listening location. In effect, the spacing "W" between the main and dimensional SDA effect or "sub" speakers was chosen to approximate the space between the ears of the listener, which allowed an interaural crosstalk cancelling inverted signal from each "sub" speaker to diminish or eliminate cross talk from the left main speaker to the right ear and from the right main speaker to the left ear, and this interaural crosstalk cancellation created the desired audible "SDA" effect for the listener. But, as shown in FIG. 1D, this system was able to render a wide and stable sonic image and pleasing tonal balance only for those listeners in or just behind the "sweet spot." When early SDA™ speaker system playback was successful, the left-to-right sound field was easily heard to extend past the physical loudspeaker's locations (so, for example, stable sonic images were audibly perceived as coming from outside and to the left of Left SDA speaker 80L). But this effect depended on sitting or standing in the "best listening area" as seen in FIG. 1D, and phasiness could be a problem, if the listener's head was turning or moving.

In Polk Audio's early SDA speaker systems (e.g., the SDA1 system 50), these and other limitations in the efficacy of the SDA effect were noted. The SDA effect was created with a band-limited interaural crosstalk cancelling inverted signal from each "sub" speaker which was typically not effective for crosstalk at frequencies above 2 Khz., but this choice was a compromise. Referring again to FIGS. 1A, 1B and 1D, users were instructed to avoid setting up the SDA speakers with "toe-in" because creating the dimensional or SDA effect required the speakers to fire "forward" or perpendicularly to the "speaker axis" line upon which the loudspeaker enclosures are arranged to achieve the proper time delay between the main and crosstalk cancelling arrays of transducers. Users of Polk's original SDA™ system and method (like the SDA1 shown in FIGS. 1B-1D) sometimes noted the perceptible "phasiness" as a tonal balance that could change in an unnatural way.

There is a need, therefore, for an improved structure and method to more reliably render the SDA effect for users listening to two channel recordings which eliminates perceived "phasiness" and enlarges the SDA effect "sweet spot" in which users experience greater image stability and specificity and greater satisfaction with the loudspeaker system's sound reproduction.

SUMMARY OF THE INVENTION

Accordingly, it is an object of the present invention to overcome the above mentioned problems with phasiness and the narrow sweet spot by providing a method and system for implementing a new form of Stereo Dimensional Array ("SDA™") signal processing which is effective when used in a pair of loudspeakers configured for placement is a listener's room or listening space.

Another object of the present invention is providing an enhanced SDA™ loudspeaker system with a more natural spectral response where tweeters are used in the SDA or dimension-effect generating transducers without any increase phasiness or image confusion, and which, in use, generates more stable sonic images for the listener.

As noted above, Polk's prior Stereo Dimensional Array (SDA™) loudspeakers were attempting to widen and stabilize sonic images within an apparent sound stage between of a set of loudspeakers by sending a band-limited crosstalk cancelling signal from the opposite side of the primary speaker. Using prior art SDA methods, the applicants observed that the sound that reaches the opposite (e.g., right) ear from the primary (e.g., left) speaker is acoustically altered or effected by the head and torso of the listener. This effect is often referred to as the "head shadow" or "head related transfer function" ("HRTF"). In revisiting the challenges to making an improved SDA product, applicants noted that the SDA effect generating cancellation signal could be improved to better account for the head shadow ("HRTF") effect. After some experimentation, it was discovered that an improved cancellation effect could be accomplished not just in the frequency domain, but also in the time domain (or in "phase"). As noted above, in prior art SDA systems (e.g., 50) the SDA effect was created with a band-limited interaural crosstalk cancelling inverted signal from each "sub" speaker which was typically not effective for crosstalk at frequencies above 2 Khz., so the compromise in this choice was reconsidered in this development effort.

The method and structure of the improved SDA loudspeaker system of the present invention were developed by evaluating and manipulating three factors, namely (a) controlling delay from the crosstalk cancelling speaker due to its physical location on the loudspeaker system enclosure or baffle surface, (b) aiming the cross talk cancelling speaker's radiation and using the speaker's inherent dispersion characteristics and (c) electronic equalization as cooperative elements which, together, produce or generate an enhanced crosstalk cancelling signal which is more effective in cancelling crosstalk at frequencies in the range of 2 KHz-about 5 KHz.

The previous SDA loudspeakers (e.g., the SDA1, described above) did not adequately address these considerations.

By considering (a) delay from the crosstalk cancelling speaker due to its physical location on the loudspeaker baffle, (b) its inherent dispersion characteristics and (c) electronic equalization in a new way, using the method of the present invention, the operative frequency range of the crosstalk cancelling transducers was increased. SDA effect generating or crosstalk cancelling "Dimensional" midrange and tweeter drivers are configured in an array on specially aimed baffles and provided with SDA cancellation effect signals which combine to extend higher in frequency without introducing issues with phasiness and the narrowing sweet spot. This extension in higher frequencies causes the overall tonality of the loudspeaker system of the present invention to be more natural and increases the listener's sense of envelopment.

As shown in FIGS. 1A-1D, traditional SDA speakers (e.g., 80L, 80R) fired forward from planar front baffles, perpendicular to the "speaker axis" line upon which they are arranged, to achieve the proper time delay ($\Delta t_{max}$) between the main and crosstalk cancelling arrays of transducers. This configuration aims the radiation pattern of the main array's tweeter and midrange straight ahead and thus 15-30 degrees away from the listener's head (when centered between the L and R speakers). At this angle, tweeters in each loudspeaker have unacceptable amount of high frequency attenuation due to their natural dispersion or radiation pattern characteristics.

In the new SDA system of the present invention, this problem is overcome by configuring a tower-shaped loudspeaker enclosure with a front baffle having first and second diverging angled upper segments or facets. An upper left segment is oriented to aim a selected angle (e.g., 15 degrees) to the left and an upper right segment is oriented to aim at the same selected angle (e.g., 15 degrees) but diverges to the right, so neither baffle segment points straight ahead. The angled facets or baffle segments aim the drivers with angled upper baffle segments or facets such that the "main" or stereo tweeter for each channel is now pointing almost directly at the listening location. The "main" or stereo midrange is also mounted on the same angled baffle (or slanted planar surface) and aimed at the listening location so that the combination of the main tweeter and main midrange create a better dispersion pattern with a more pleasing overall tonal balance due to that baffle being effectively "toed in" toward the listening location.

The left speaker system enclosure has it's "main" tweeter and midrange drivers aligned vertically in an array aimed from the upper right inwardly angled baffle segment (aimed at the listening location) and also has an "effects" or SDA dimensional cancellation effect generating midrange and tweeter driver array on the upper left segment, where the SDA dimensional baffle is angled or slanted to aim the SDA midrange and the SDA tweeter away from the listening location.

Following the same acoustic principles, the mirror-imaged right speaker system has it's "main" tweeter and midrange drivers aimed from the upper left angled segment (aimed at the listening location) and also has an "effects" or SDA dimensional midrange and tweeter driver array on the upper right segment, where the SDA dimensional baffle is angled or slanted to aim the SDA midrange and the SDA tweeter away from the listening location.

One issue which commercial product manufacturers must consider is how to make something that customers actually want to buy and retailers actually want to offer. Modern retailers for audio products are part of a distribution channel which includes wholesalers and very large retail businesses (e.g., "big box" retail store operators) which have preconceived biases or requirements which make some products easier to market and other products more difficult to market. Distribution channels for loudspeakers strongly discourage and will not often carry loudspeakers products that have different left and right speaker products (e.g., with differing product or Stock Keeping Unit "SKU" identifiers). This means that in some commercial channels there is likely to be to a Stereo SDA loudspeaker system which has distinct left and right channel products, meaning a "left" speaker (with a right-slanted baffle, to aim at the listener) which differs from it's paired "right" speaker (with a left-slanted baffle, to aim at the listener). The addition of a tweeter on the crosstalk cancelling side of the new SDA loudspeaker now allows the speaker (as a product or "SKU") to be symmetrical, thereby providing an option for resolving this issue. The result is a loudspeaker system front baffle with two diverging arrays, each mounted on conjoined, preferably planar left and right side baffle segments or facets which diverge a selected angle (e.g., 15 degrees) from a transverse vertical plane defined along what, in FIG. 1A would otherwise been have been the "speaker axis". The symmetrically angled conjoined intersecting left and right side baffles can intersect in a forward-facing or distal edge to define left and right side angled baffle planes or facets meeting at an acute angle of, preferably 150 degrees (as seen from within the loudspeaker enclosure) or defining an outside corner of two planes which meet at an angle of 210 degrees, as seen from the listener's position, in front of the speaker(s). This baffle aiming angle is described and illustrated in these embodiments as being (preferably) 15 degrees to the left and right of a listening axis, but could be rendered (effectively enough, with crossover changes) using baffles angled symmetrically back from a horizontal plane in any angle within the range of 10 degrees and 30 degrees.

The angled first and second arrays are then are then fed signals from a new crossover which is optionally configurable using switches or jumpers such that either (e.g., left baffle or right baffle) array can be selected by the user or installer as being (a) the main array or (b) SDA/effects array by rerouting signals through a switch or jumper block.

The method and system of the present invention preferably implements a new broader spectrum SDA signal processing method in a "stereo pair" of traditional standalone loudspeakers, which, during playback, more effectively presents a wide sweet spot, a pleasing tonal balance and reduced "phasiness", as compared to prior art SDA systems (e.g., as shown in FIGS. 1A-1D). Optionally, each loudspeaker may be configured as an identical product or SKU (e.g., a single enclosure SDA loudspeaker system) which achieves a surprisingly effective psycho-acoustically expanded image breadth by implementing a new type of cancellation signal generation for sources of undesirable inter-aural crosstalk.

The new SDA system and method of the present invention was designed and configured to provide four advantages, namely (1) a more natural spectral response of the loudspeakers, (2) allowing tweeters to be used in the SDA effects or dimensional speaker array without increased phasiness or image confusion, (3) improving the imaging of SDA, and optionally (4) removing commercial concerns around having separate left and right loudspeaker products (or SKUs).

In the new SDA system, a stereo pair of loudspeaker enclosures is configured in a listening space with a listening location, each loudspeaker system's enclosure has the dual array aiming beveled or faceted front baffle which carries and aims first and second midrange driver and tweeter arrays, with the new crossover which provides appropriately filtered signals to the each of the drivers in each array.

In an early prototype embodiment, a first midrange driver is mounted on a first angled baffle surface or facet and a second midrange driver is mounted on a second angled baffle surface or baffle, and a single tweeter is mounted near (e.g., just above) both angled baffle surfaces on the loudspeaker's front baffle.

In a second (preferred) embodiment, a first midrange driver and first tweeter are mounted on a first angled baffle surface or facet and a second midrange driver and second tweeter are mounted on a second angled baffle surface or baffle, where both angled baffle surfaces are part of the loudspeaker's front baffle. This second embodiment provides an enhanced SDA "main stereo pair" loudspeaker product which more effectively overcomes the problems/issues with the original SDA (including perceived phasiness and a narrow sweet spot) in a loudspeaker system having a left speaker tower and a right speaker tower which can be easily set up in a listening space by a listener, user or installer.

The acoustic centers of the drivers on left angled baffle and the right angled baffle are preferably approximately 6.5" apart. In a preferred embodiment, each tweeter/midrange array is aligned along a substantially vertical axis which is centered on an angled baffle, so, for the left loudspeaker tower enclosure, the "main" tweeter is mounted directly above the "main" midrange driver on the upper right angled segment (aimed at the listener) and the "effects" or SDA dimensional tweeter is above and vertically aligned with the effects or SDA midrange on the upper left segment, where the SDA dimensional baffle is angled or slanted to aim the SDA midrange and the SDA tweeter away from the listener. The acoustic centers separating the left angled baffle tweeter and right angled baffle tweeter are preferably approximately 6.5" apart, and the acoustic centers separating the left angled baffle midrange and right angled baffle midrange drivers are also that same distance (e.g., preferably approximately 6.5") apart.

When two of the loudspeaker system towers of the present invention are placed in a typical stereo-listening arrangement in a listener's space or room, the inner-baffle set of drivers (aiming on an axis toward the centered listener or listening location) play the standard (or main stereo) left and right signals from an amplifier (e.g., 54). The outer-baffle set of drivers (aiming on an axis away from the centered listener) play the crosstalk cancellation or SDA dimensional effect signals. Crosstalk cancellation (or SDA dimensional effect) signals are generated by crossover circuits connecting the loudspeakers to the amplifiers such that the left tower gets an "L-R" signal and the right tower gets an "R-L" signal. An electrical crossover network is used to make the crosstalk cancelling signals used to drive the dimensional or SDA effect tweeter/midrange driver array by matching the main tweeter/midrange driver array's signal and compensating for the headshadow. In the prototype a simple R-L shelf circuit was used to achieve this.

The above and still further objects, features and advantages of the present invention will become apparent upon consideration of the following detailed description of a specific embodiment thereof, particularly when taken in conjunction with the accompanying drawings, wherein like reference numerals in the various figures are utilized to designate like components.

DESCRIPTION OF THE PREFERRED EMBODIMENT

Turning now to FIGS. 2A-10, the present invention comprises an enhanced or improved SDA "main stereo pair" loudspeaker system 250 including a left tower enclosure 280L and a right tower enclosure 280R which overcomes the issues encountered with the original SDA system (e.g., 50).

Figure 2A:
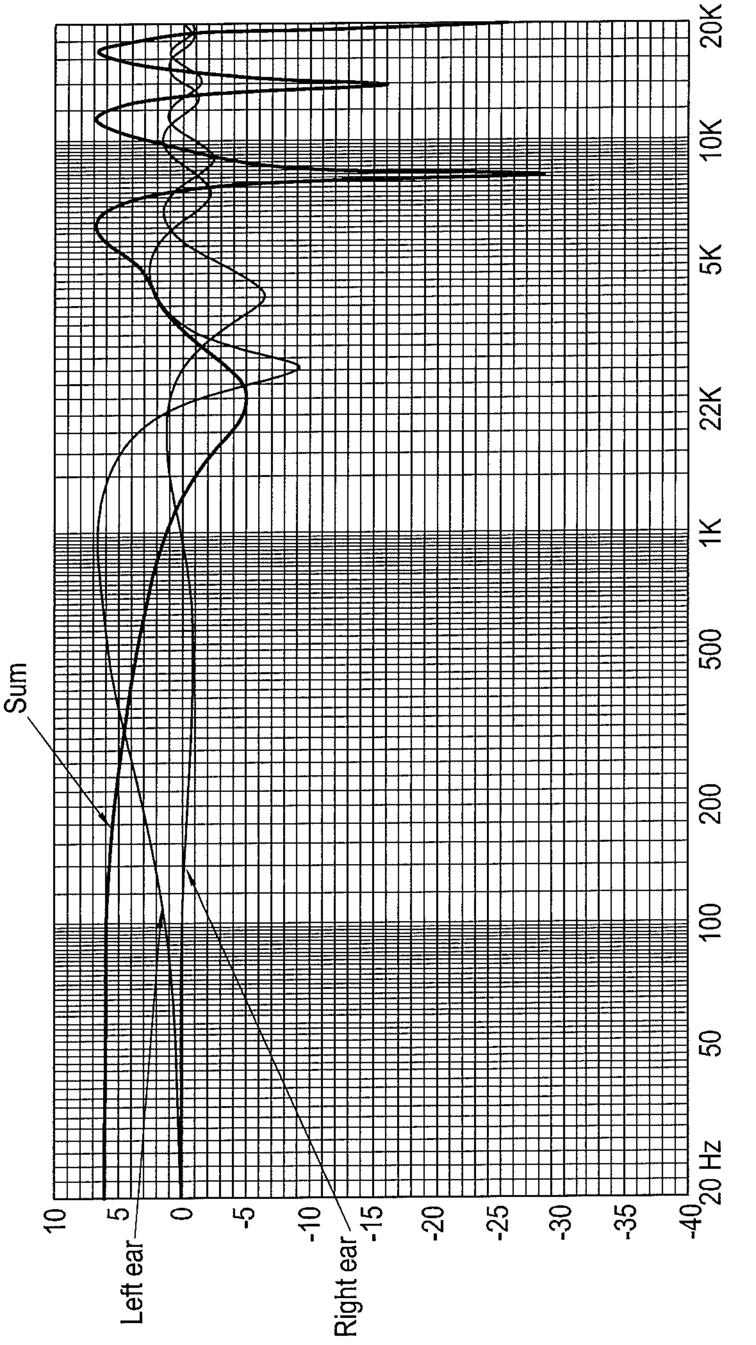
FIG. 2A is a spectral plot illustrating plots received at the listener's left ear, right ear and the acoustic sum, for an SDA effect generating speaker which does not include a head shadow compensating filter in the speaker's crossover.
Figure 2B:
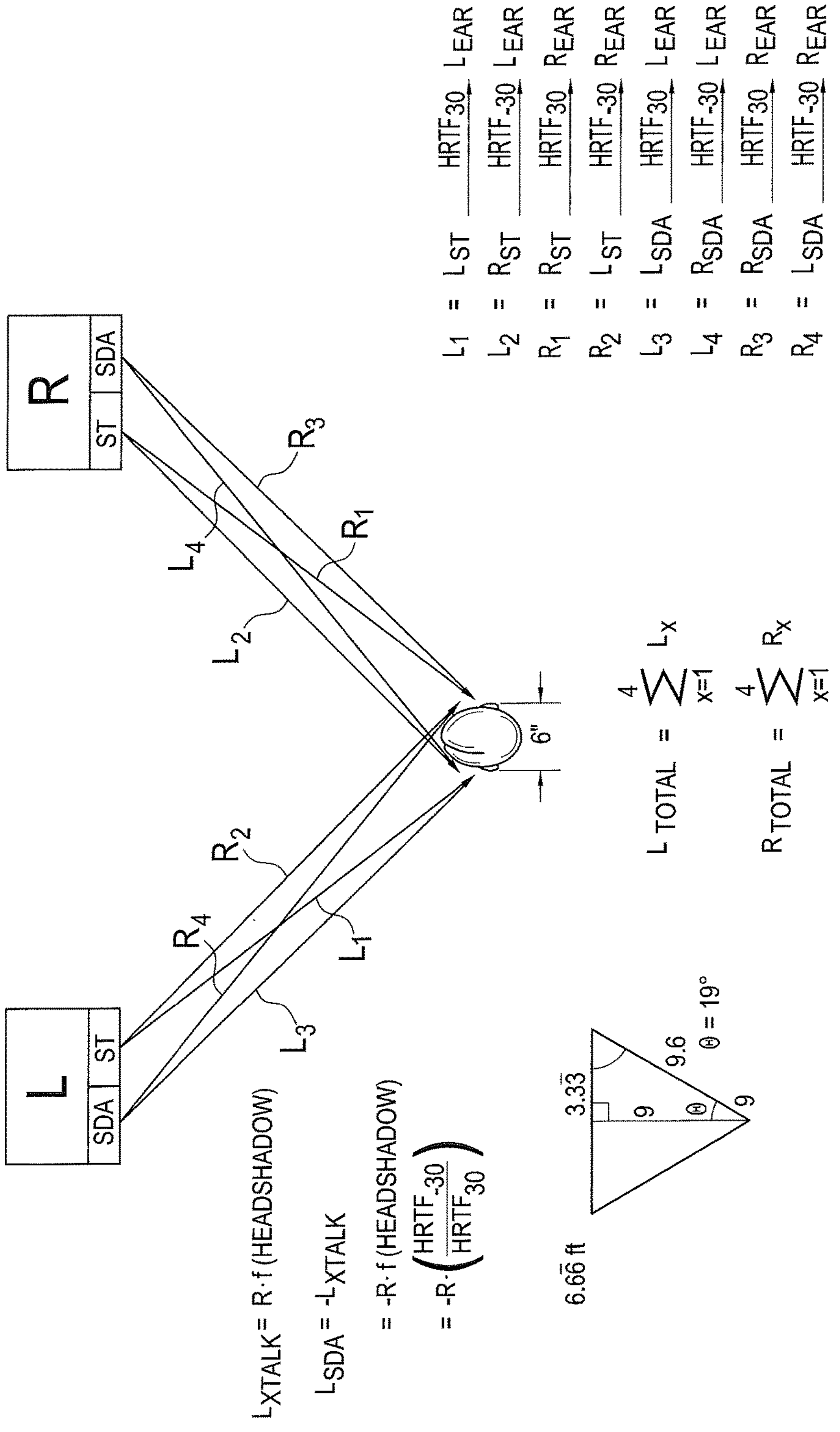
FIGS. 2B and 2C are diagram illustrating the new approach for generating a head shadow filter enhanced SDA effect for a listener, in accordance with the structure and method of the present invention.
Figure 2C:
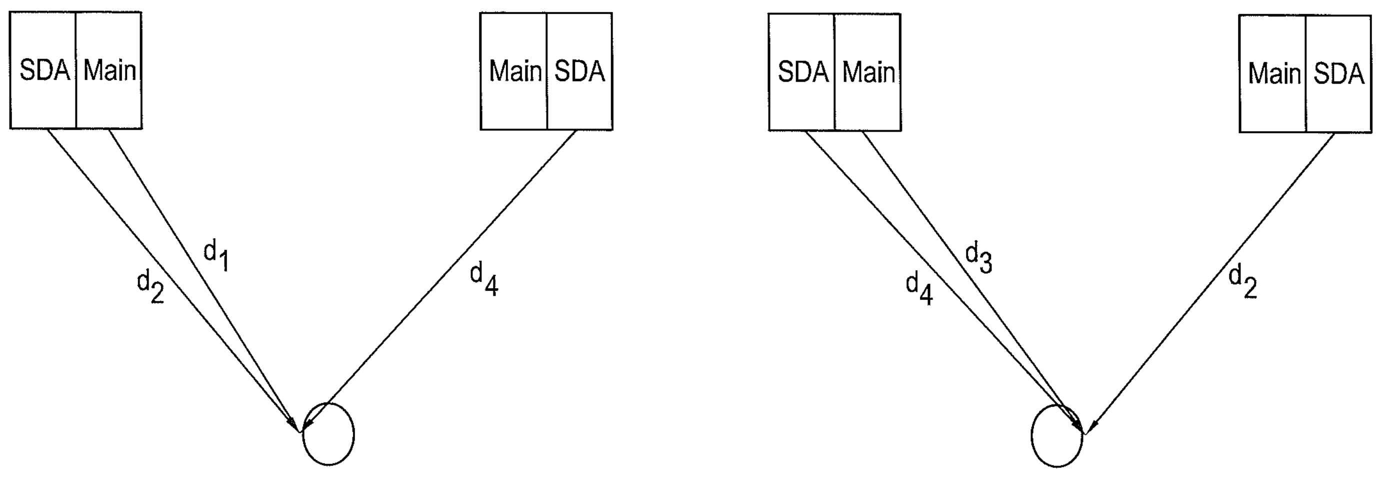

FIG. 2A illustrates part of the problem with the SDA systems described above. In this development effort, applicants recognized that, as shown in FIG. 2A, the SDA effect was created with a band-limited interaural crosstalk cancelling inverted signal from each "sub" speaker which was typically not effective for crosstalk at frequencies above about 2 Khz., so this compromise became a focus of the development effort. An improvement in SDA effect bandwidth was sought to generate an enhanced crosstalk cancelling signal which is more effective in cancelling crosstalk at frequencies in the range of 2 KHz to about 5 KHz. FIG. 2A is a diagram which illustrates applicant's early prototype design considerations for generating an enhanced SDA effect for a listener. The principal differences between the system and method of the present invention (now referred to as the Challenger SDA system 250) and the SDA systems of the prior art (e.g., 50) are (a) a new implementation of a "Head-Shadow" filter, optimized for use with (b) first and second angled or divergently aimed baffles carrying a "main" tweeter/midrange driver array on a first baffle beside a dimensional or SDA cancellation effect tweeter/midrange driver array on a second baffle, where each tower enclosure has the paired angled baffles aiming at selected angles from a reference plane projecting in parallel to the listening axis and perpendicularly to the speaker axis (best seen in FIG. 8B).

Figure 4:
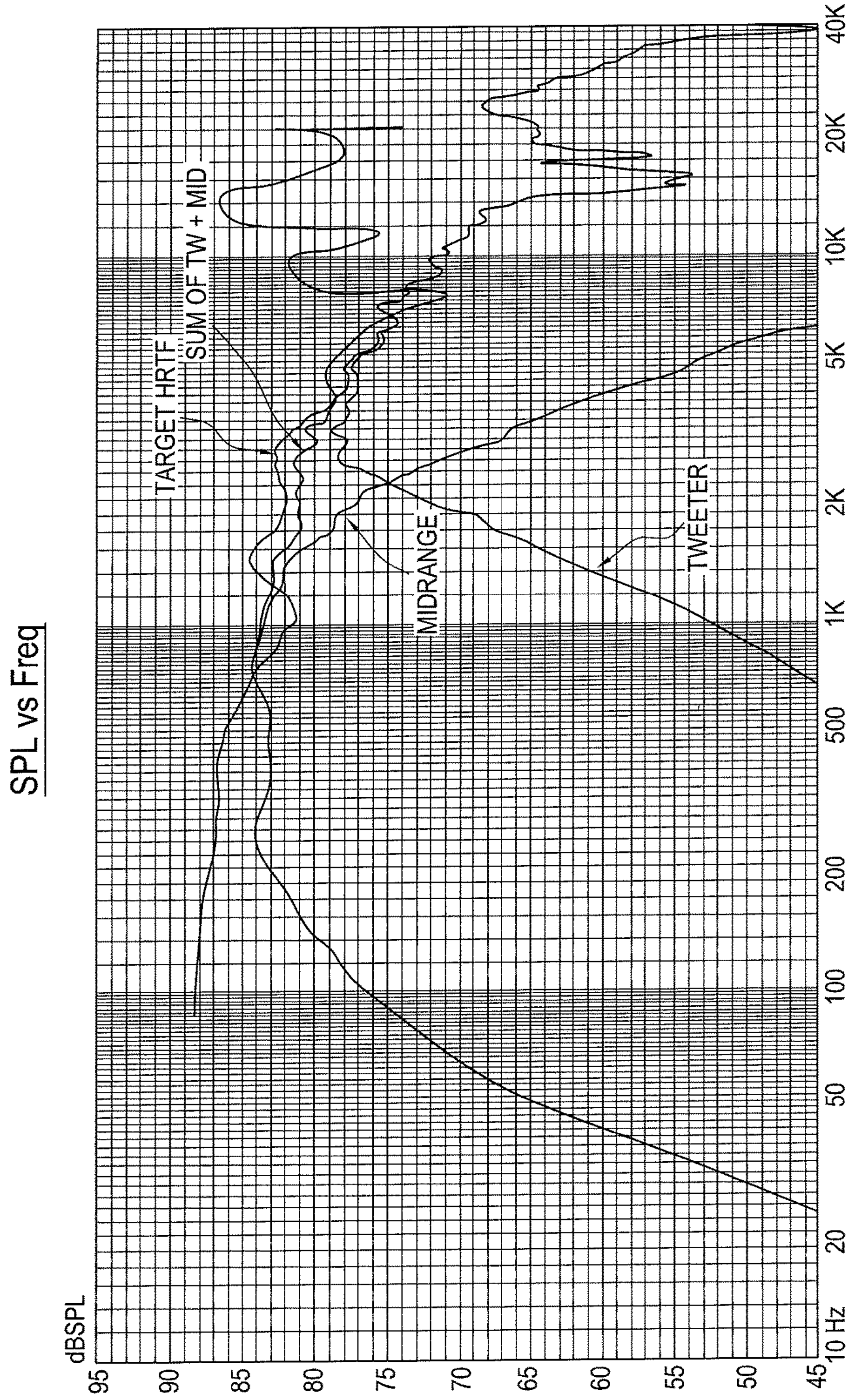
FIG. 4 illustrates an SPL v. frequency plot for a prototype crosstalk cancelling driver array or SDA effect section of the loudspeaker, in accordance with the structure and method of the present invention.
Figure 5:
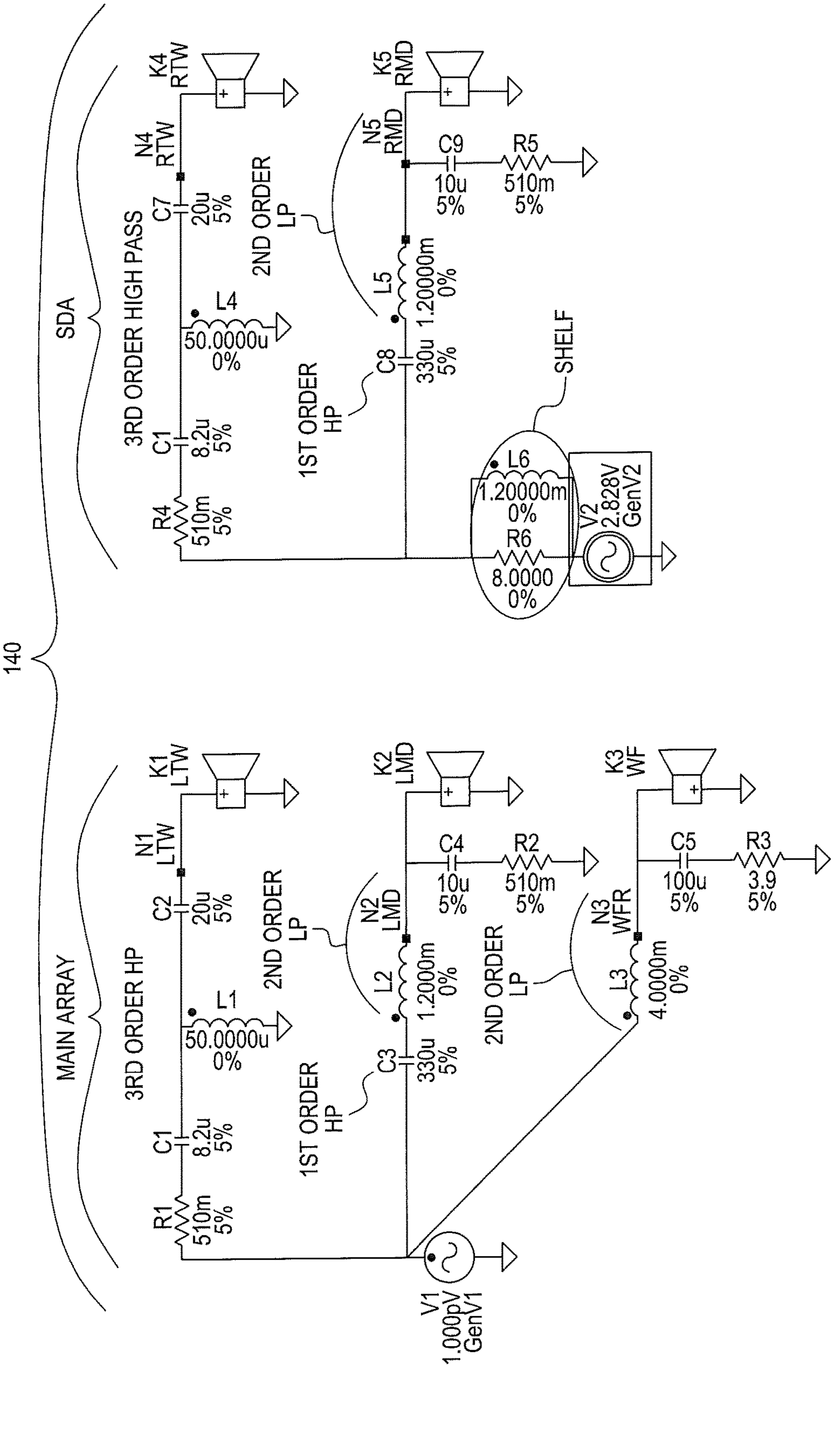
FIG. 5. illustrates a crossover circuit schematic for an initial prototype wherein the rightmost section illustrates connections for the crosstalk cancelling or dimensional SDA effect speakers and where R6 and L6 define a "shelf" filter section which comprises the head shadow mimicking portion, in accordance with the structure and method of the present invention.

FIG. 4 illustrates an SPL v. frequency plot for an improved Headshadow compensating crosstalk cancelling section of the loudspeaker, in accordance with the structure and method of the present invention. The new SDA loudspeaker enclosure configuration includes first and second angled baffles segments or facets (e.g., 192, 194) and the SDA baffle midrange driver (e.g., in the prototype illustrated in FIG. 6B) is a 4" midrange while the tweeter is a 1" ring radiator tweeter. The transducers must have the necessary bandwidth to create the Head Shadow compensating effect as described below. Alternatively, the selected transducers for the Main or SDA baffles could be single full range transducers. FIG. 5. illustrates a crossover schematic for an initial prototype crossover 140 where the rightmost section illustrates connections for the crosstalk cancelling speakers and R6 and L6 define a "Shelf" filter section which comprises the head shadow compensating (or mimicking) portion, in accordance with the structure and method of the present invention. The "shelf" filter section shown in FIG. 5 is better suited for use in this system than a Low Pass filter section because it can render the Head shadow compensating filter response shape more effectively (in comparison, a similar Low Pass Filter would roll off high frequencies excessively and change the tonal balance adversely).

Figure 9B:
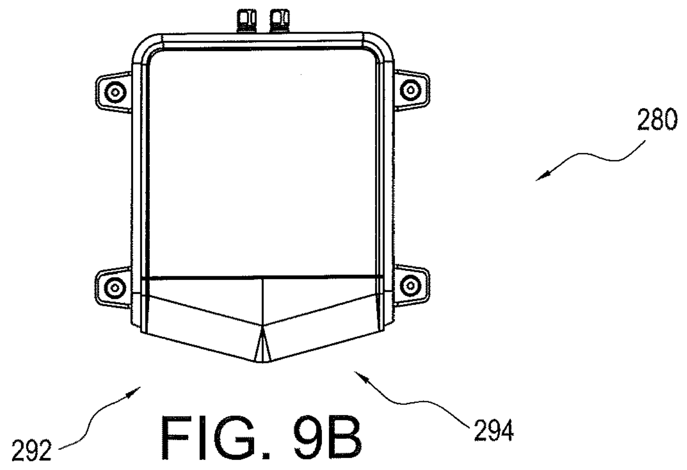
FIGS. 9A-9E, are several views of the new "SDA" loudspeaker system and method, in accordance with the present invention.
Figure 9A:
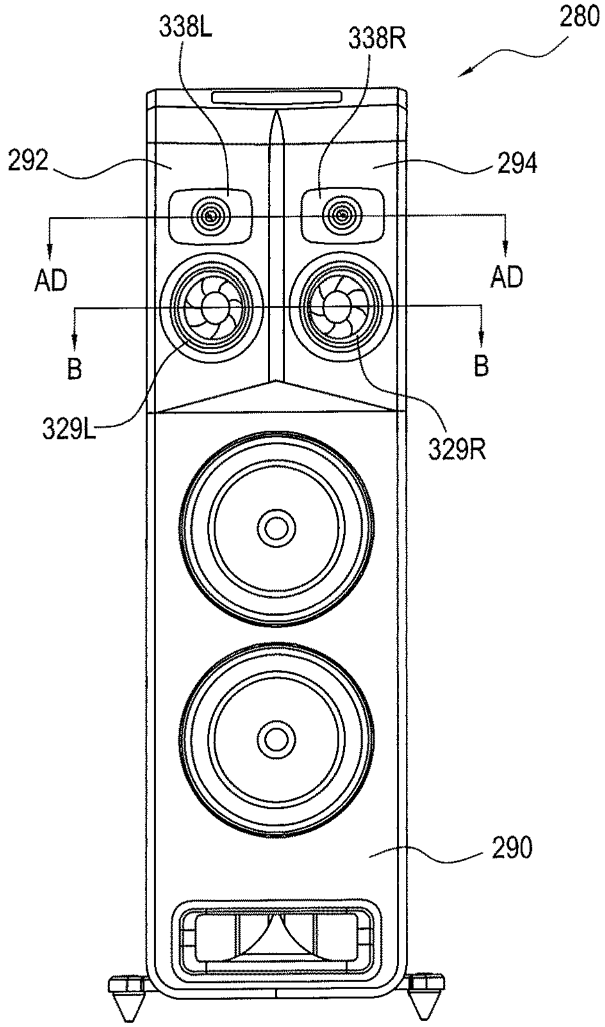
Figure 9D:
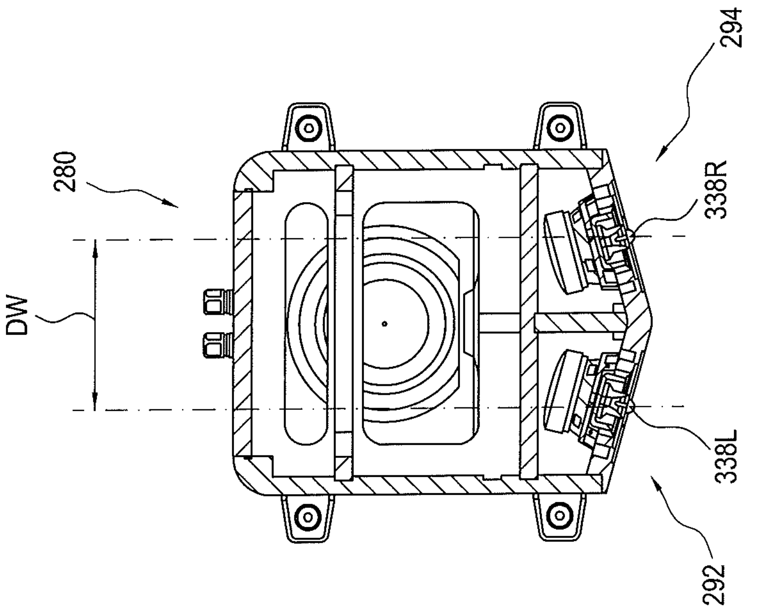
Figure 9C:
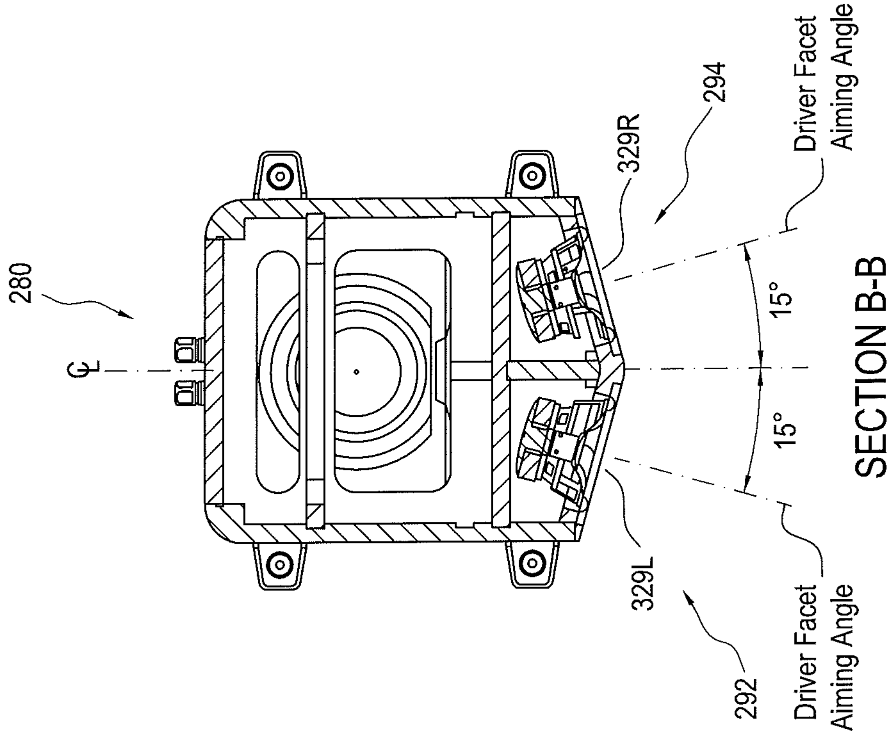
Figure 9E:
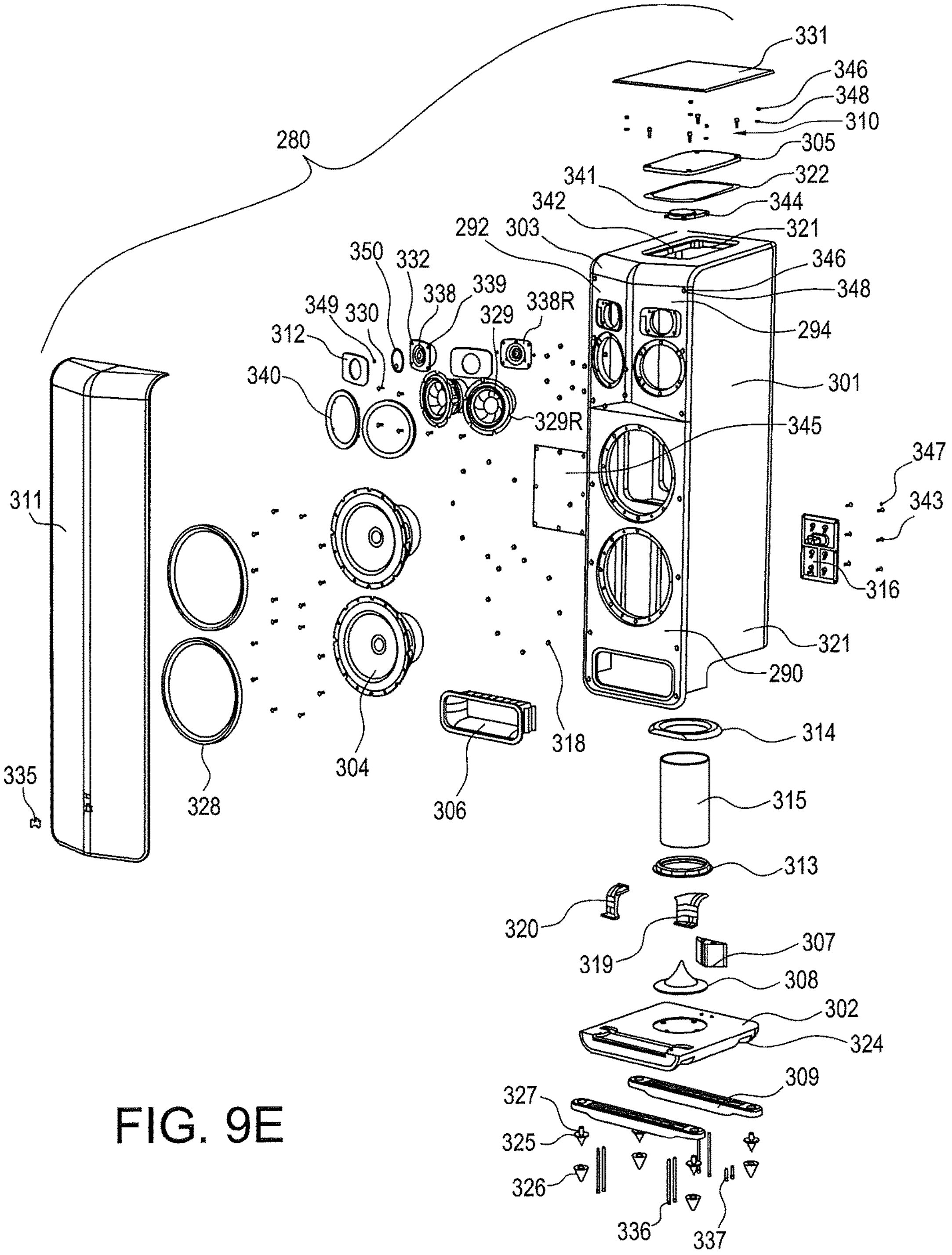

An Improved SDA system (e.g., 250) includes a matched pair of tower-shaped loudspeaker enclosures, 280 with a front baffle 290 having a first angled upper segment or facet 292 and a second diverging angled upper segment or facet 294 (best seen in FIGS. 9A, 9C and 9D). First or upper left segment 292 is oriented to aim a selected angle (e.g., 15 degrees) to the left and second or upper right segment 294 is oriented to aim at the same selected angle (e.g., 15 degrees) but diverges to the right, so neither baffle segment or facet points straight ahead.

Each upper baffle segment or facet is preferably substantially planar and includes first and second driver receiving apertures configured to support and aim a pair of mounted loudspeaker drivers which are preferably aligned on a centered vertical axis (as seen in FIGS. 9A, 9C and 9D). Each upper baffle segment or facet 292, 294 thus aims a tweeter driver 338 and a midrange driver 329 which are aligned on a vertical axis within the baffle segment's planar surface and the drivers in each array are time-aligned by the orientation of the baffle segment surface and the mounting depth within the mounting baffle's thickness (e.g., 25 mm thick MDF). So each enclosure 280 has on its front baffle 290 an angled upper left baffle segment or facet 292 which aims a vertically aligned left side driver array including left array tweeter driver 338L and left array midrange driver 329L. Enclosure front baffle 290 also includes non-parallel, diverging right baffle segment or facet 294 which aims a vertically aligned right side driver array including right array tweeter driver 338R and right array midrange driver 329R.

The angled facets or baffle segments 292, 294 support and aim their driver arrays such that the "main" or stereo tweeter for each channel (e.g., 338R for left speaker tower 280L) is now pointing almost directly at the listening location. The "main" or stereo midrange (e.g., 329R for left speaker tower 280L) is also mounted on the same angled baffle (e.g., 294L for left speaker tower 280L) and aimed at the listening location so that the combination of the main tweeter and main midrange create a better dispersion pattern with a more pleasing overall tonal balance due to that baffle (294L) being effectively "toed in" toward the listening location.

Once the crossovers are installed in the enclosures, the system 250 becomes a pair of matched enclosures 280L, 280R, so left speaker system enclosure 280L has it's "main" tweeter and midrange drivers 338, 329 aligned vertically in an array aimed from the upper right inwardly angled baffle segment 294L (aimed at the listening location, see FIG. 8B) and also has an "effects" or SDA dimensional cancellation effect generating midrange and tweeter driver array 338, 329 on the upper left segment 292L, where the SDA dimensional baffle segment or facet 292L is angled or slanted to aim the SDA midrange and the SDA tweeter away from the listening location.

Following the same acoustic principles, when system 250 is installed in the listening space, the mirror-imaged right speaker system 280R has its "main" tweeter and midrange drivers 338, 329 on the upper left angled segment 292R aimed at the listening location and also has its "effects" or SDA dimensional midrange and tweeter drivers 338, 329 arrayed on the upper right segment 294R, where the SDA dimensional baffle 294R is angled or slanted to aim the SDA midrange and the SDA tweeter away from the listening location.

Referring again to FIG. 8B, when setting up the new SDA system 250, a stereo pair of loudspeaker enclosures 280L 280R is configured in a listening space with a listening location, each loudspeaker system's enclosure 280 has the dual array aiming beveled or faceted front baffle 290 which carries and aims first and second midrange and tweeter arrays, with a new crossover (see, e.g., FIGS. 5 and 10) which provides appropriately filtered signals to the each of the drivers in each array.

Figures 6A, 6B:
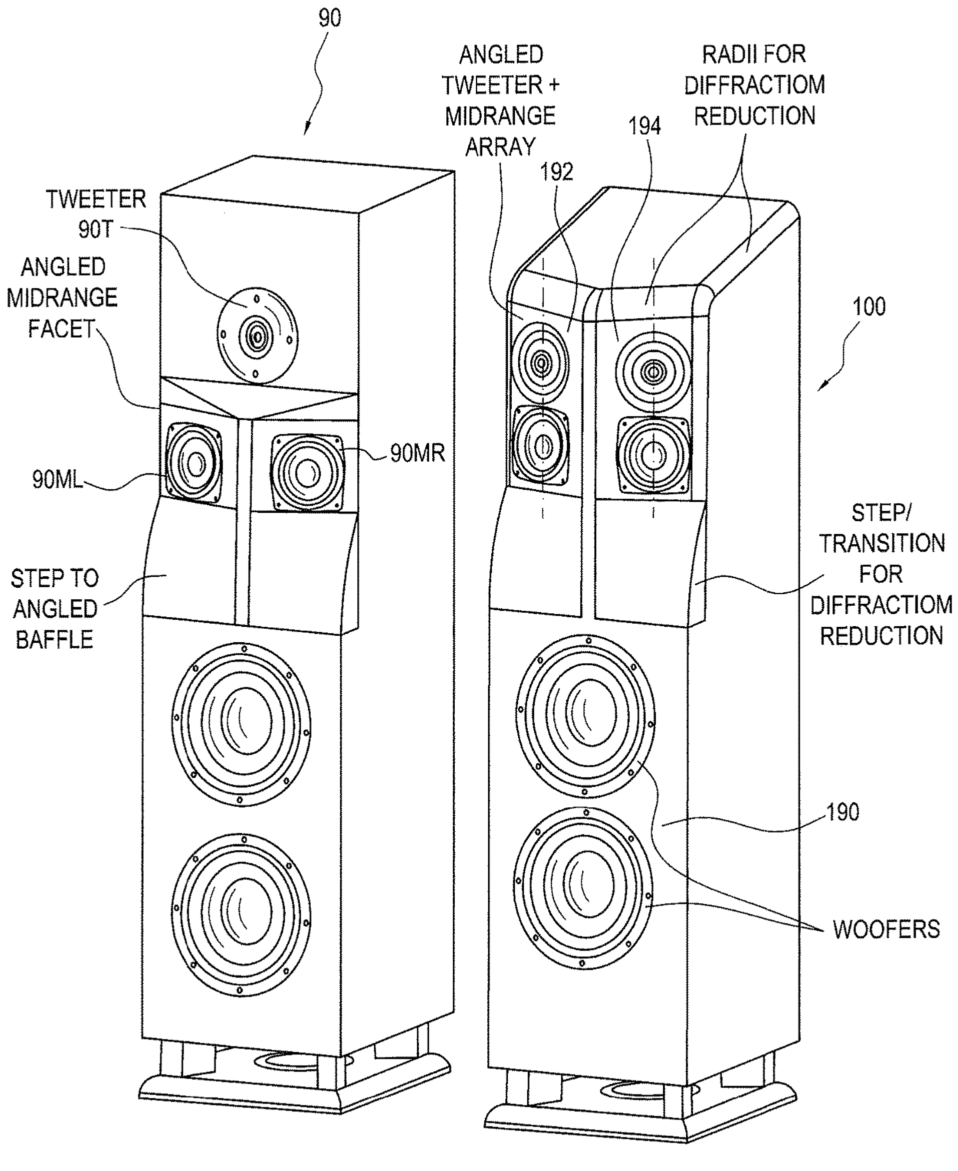
FIGS. 6A and 6B illustrate early prototypes for a preferred embodiment of the user or installer configurable, single SKU, multi-faceted or multi-baffle SDA loudspeaker system, in accordance with the structure and method of the present invention.

In an early prototype loudspeaker system tower 90 shown in FIG. 6A, a first midrange driver 90ML is mounted on a first angled baffle surface or facet and a second midrange driver 90MR is mounted on a second angled baffle surface or baffle, and a single tweeter 90T is mounted near (e.g., just above) both angled baffle surfaces on the loudspeaker's front baffle. This early prototype incorporated a crossover network similar to that shown in FIG. 5 (but without the crossover portion for the SDA effect tweeter) and was not really effective enough at presenting the advantages sought in applicants' development work.

In a second early embodiment of the improved SDA loudspeaker system 100 (as shown in FIG. 6B), a first midrange driver and first tweeter are aligned along a vertical axis on a first angled baffle surface or facet 192 and a second midrange driver and second tweeter are aligned along a vertical axis on a second angled baffle surface or baffle 194, where both angled baffle surfaces are part of the loudspeaker's front baffle 190. This second embodiment tower 100 provides an enhanced SDA "main stereo pair" loudspeaker product which more effectively overcomes the problems/issues with the original SDA (including perceived phasiness and a narrow sweet spot) in a loudspeaker system having a left speaker tower and a right speaker tower (not shown) which can be easily set up in a listening space by a listener, user or installer.

The vertical axes and aligned acoustic centers of the drivers on left angled baffle 192 and the right angled baffle 194 are preferably spaced apart laterally at a distance ("W", which is a function of $\Delta t_{max}$) of approximately 6.5 inches. In the preferred embodiment, each tweeter/midrange array is aligned along its substantially vertical axis which is centered on its angled baffle segment, so, for a left loudspeaker tower enclosure, the "main" tweeter was mounted directly above the "main" midrange driver on the upper right angled segment 194 and aimed at the listener and the "effects" or SDA dimensional tweeter was above and vertically aligned with the effects or SDA midrange on the upper left segment 192, where the SDA dimensional baffle (192, for a left side tower enclosure, similar to 280L, in FIG. 8B) is angled or slanted to aim the SDA midrange and the SDA tweeter away from the listening position. This prototype loudspeaker tower 100 incorporates a crossover network 140 (FIG. 5) and the connections to drivers made in a specific enclosure render that enclosure either a Left channel tower or a Right channel tower. Referring again to FIG. 5, for a Right channel tower, the "main array" connections are made (a) from K2-LMD to the midrange driver on upper left baffle segment 192 and (b) from K1-LTW to the tweeter driver also on upper left baffle segment 192; following this method, the "SDA" or dimensional array connections are made (a) from K5-RMD to the midrange driver on upper right baffle segment 194 and (b) from K4-RTW to the tweeter driver also on upper right baffle segment 194.

In the exemplary embodiment of FIG. 6B, the angled wall segments recede symmetrically to the rear at an aiming angle of 15 degrees, but these baffles need not be symmetrical and can recede at selected aiming angles in the range of 10-30 degrees, and those angles may vary to accommodate drivers with different radiation patterns. For this exemplary embodiment, the acoustic centers separating the left angled baffle tweeter and right angled baffle tweeter are preferably approximately 6.5" apart, and the acoustic centers separating the left angled baffle midrange and right angled baffle midrange drivers are also that same distance (e.g., preferably approximately 6.5") apart.

Figure 8A:
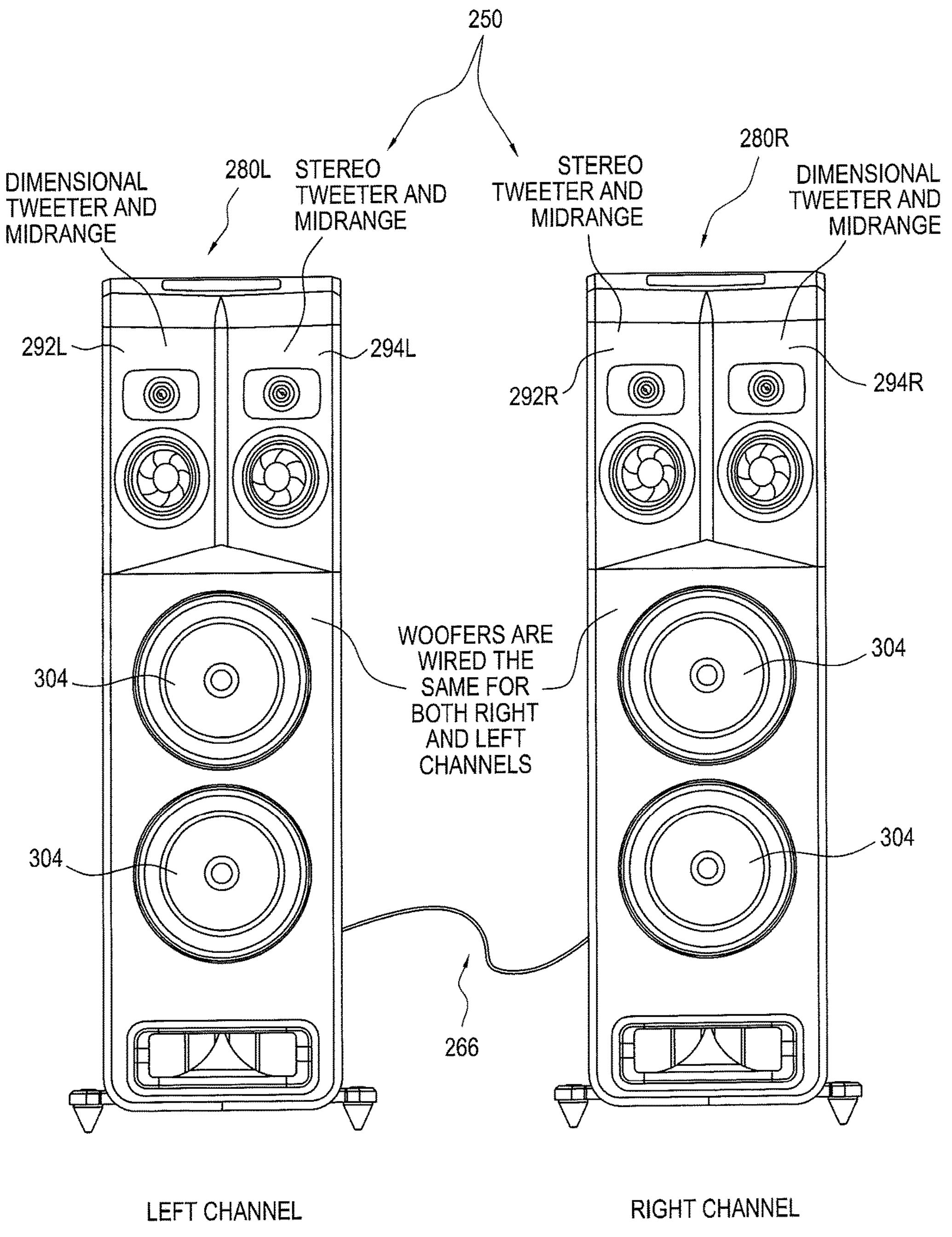
FIG. 8A illustrates another preferred embodiment of the system of the present invention including left and right multi-faceted or multi-baffle SDA loudspeaker system enclosures, in accordance with the structure and method of the present invention.
Figure 8B:
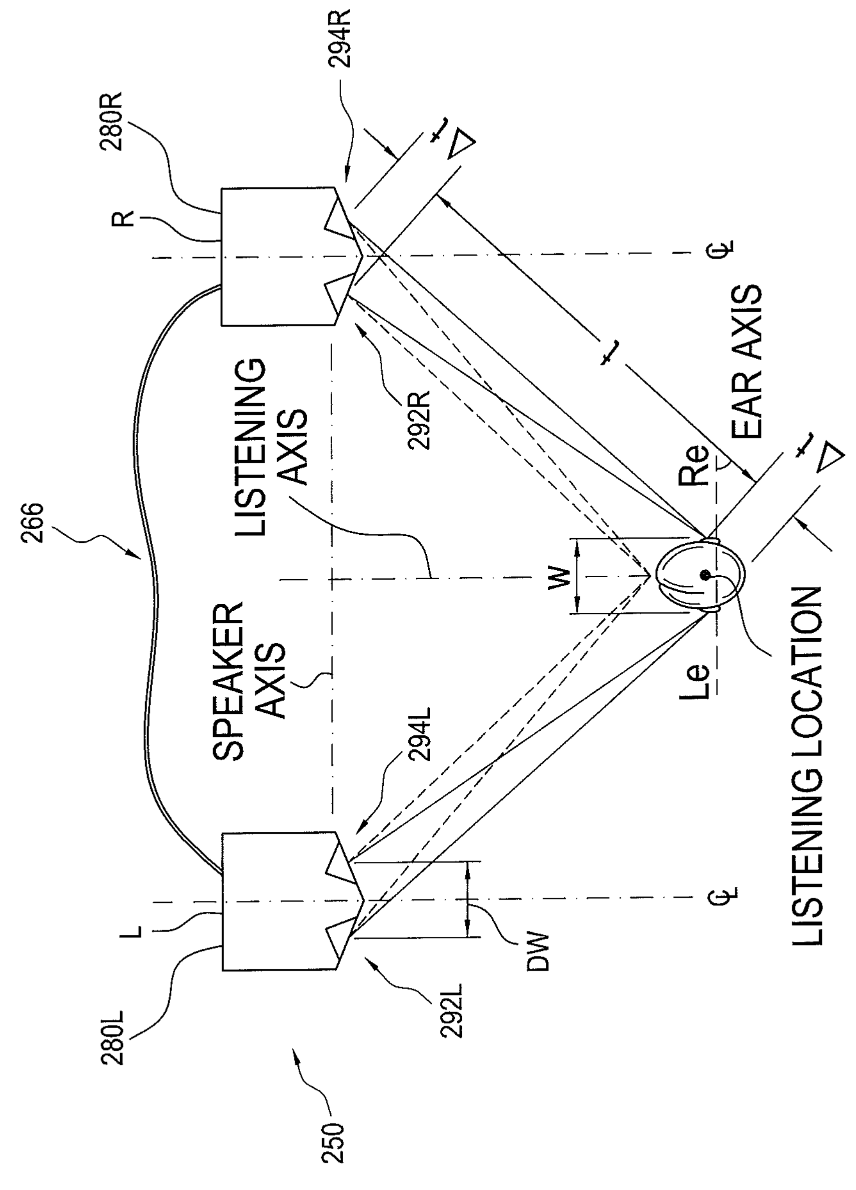
FIG. 8B is a diagram illustrating the new "SDA" loudspeaker system and method, with a stereo pair of left and right channel loudspeaker system enclosures, where both loudspeaker system enclosures are aligned along the speaker axis in front of a listening location and each loudspeaker system enclosure faces forward and in so doing, orients one baffle surface toward the listener and another baffle surface laterally outside of and away from the listener

When two of the loudspeaker system enclosures (e.g., towers 100 or 280) of the present invention are placed in a typical stereo-listening arrangement in a listener's space or room (e.g., as seen in FIG. 8B), the inner-baffle set of drivers (e.g., on baffle segments 294L and 292R) are oriented toward a baffle aiming axis and generally toward the centered listener or listening location. When installed and in use, those inner facing baffle-mounted driver arrays play the standard (or main stereo) left and right signals from an amplifier (e.g., 54). The outer-baffle sets of drivers (e.g., on baffle segments 292L and 294R) are oriented away from the listening axis and generate the crosstalk cancellation or SDA dimensional effect sounds. Crosstalk cancellation (or SDA dimensional effect) signals are generated by crossover circuits (e.g., 140 in FIG. 5 or 440 in FIG. 10) connecting the loudspeakers to one or more amplifiers (e.g., 54) such that the left tower gets an "L-R" signal and the right tower gets an "R-L" signal communicated via an SDA interconnect (e.g., 266) connecting a crossover in a left speaker (e.g., 280L) to a crossover in its paired right speaker (e.g., 280R). The crossover networks (e.g., 440) of right speaker 280R and left speaker 280L are connected to one another through connections labelled "SDA Out" and "SDA In" and an inverted right channel signal ("−R") with the low frequency components attenuated is developed and coupled to the left dimensional effect or SDA speaker via the SDA interconnect cable 266. And an inverted left channel signal ("−L") with the low frequency components attenuated is developed and coupled to the right dimensional effect or SDA speaker also via SDA interconnect cable 266, and these connections are used to make the crosstalk cancelling signals used to drive the dimensional or SDA effect tweeter/midrange driver array by matching the main tweeter/midrange driver array's signal and compensating for the headshadow. In the prototype a simple R-L shelf circuit (see, in FIG. 10, parallel circuit elements L7 and R8) was used to achieve this.

Figure 1A:
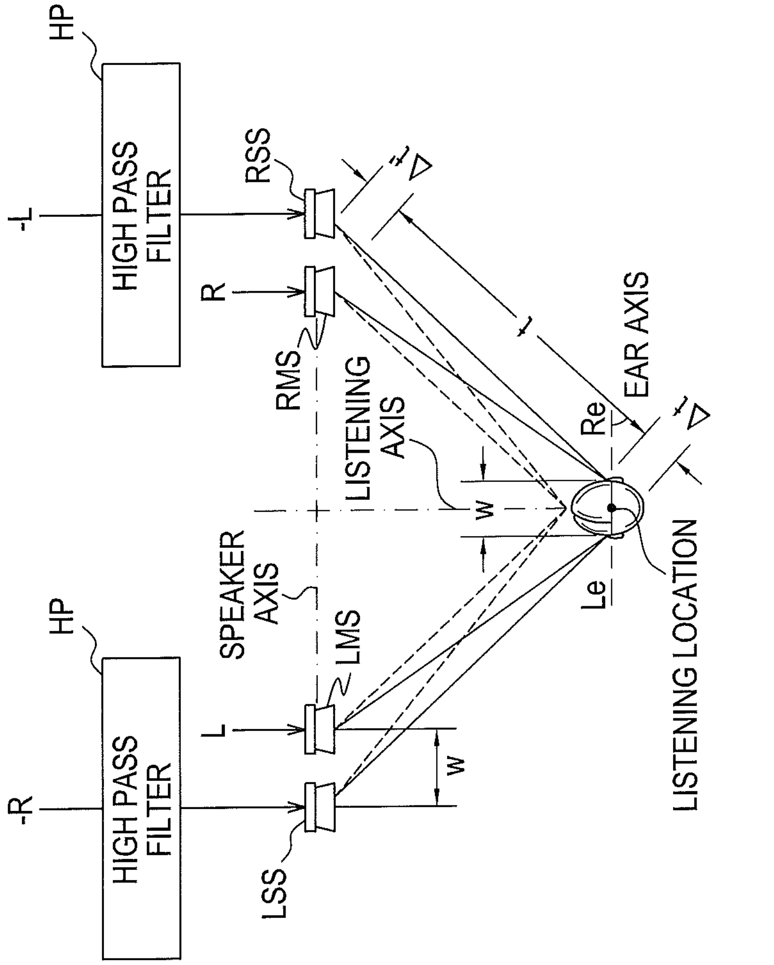
FIG. 1A Prior Art
FIG. 1A is a diagram illustrating Mathew Polk's original "SDA" loudspeaker system and method, with a stereo pair of "main" left and right channel speakers (LMS, RMS) each including a corresponding "sub" speaker (LSS, RSS), where all four loudspeaker drivers are aligned along a speaker axis in front of a listening location, in accordance with the prior art.
Figure 1B:
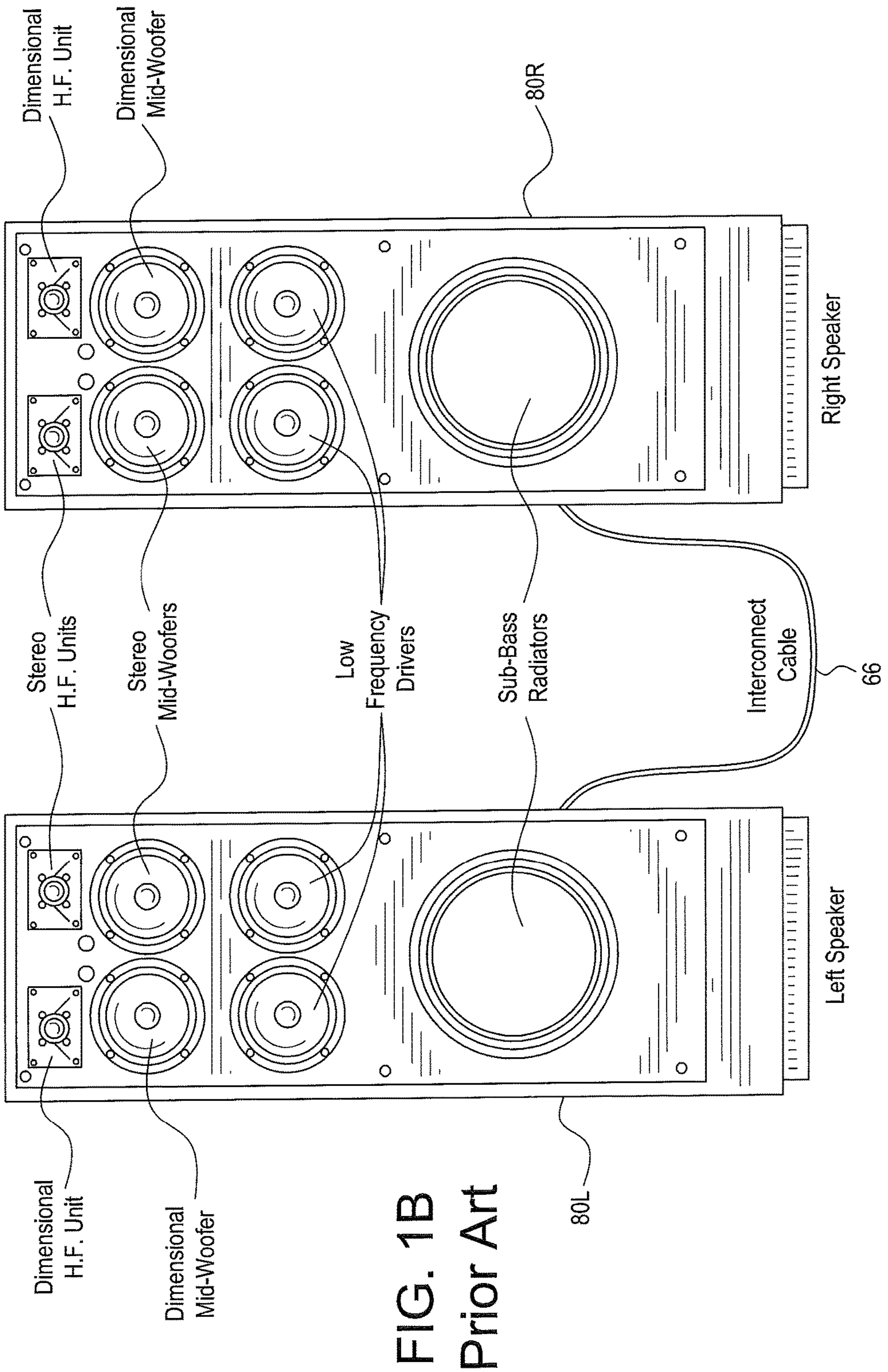
FIG. 1B Prior Art
FIG. 1B illustrates Polk Audio's original "SDA1™" loudspeaker system and setup method, with a pair of loudspeaker enclosures including the "main" left and right channel speakers (LMS, RMS) each including a corresponding "sub" or SDA effects speaker (LSS, RSS), where all four loudspeaker drivers are aligned along a planar front baffle surface aligned on the speaker axis in front of a listening location, in accordance with the prior art.
Figure 1C:
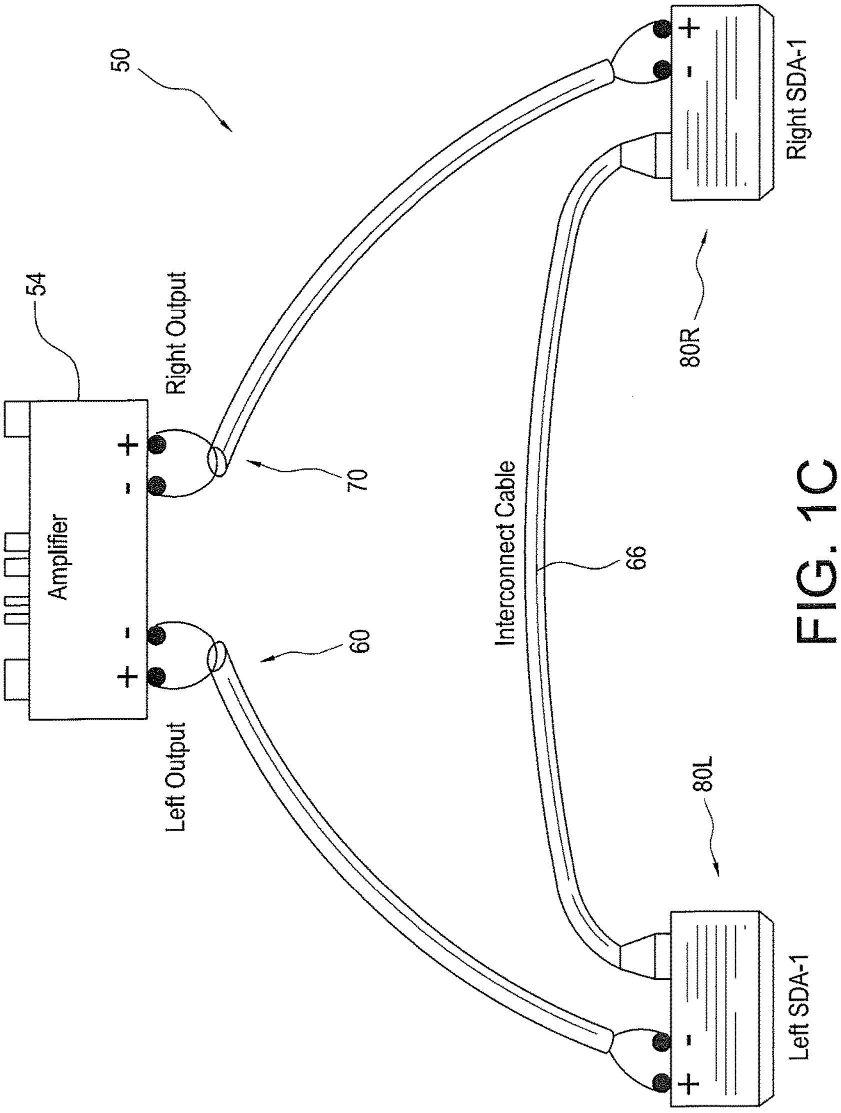
FIG. 1C Prior Art
FIGS. 1C and 1D illustrate the setup method for Polk Audio's original "SDA1™" loudspeaker system, in accordance with the prior art.
Figure 1D:
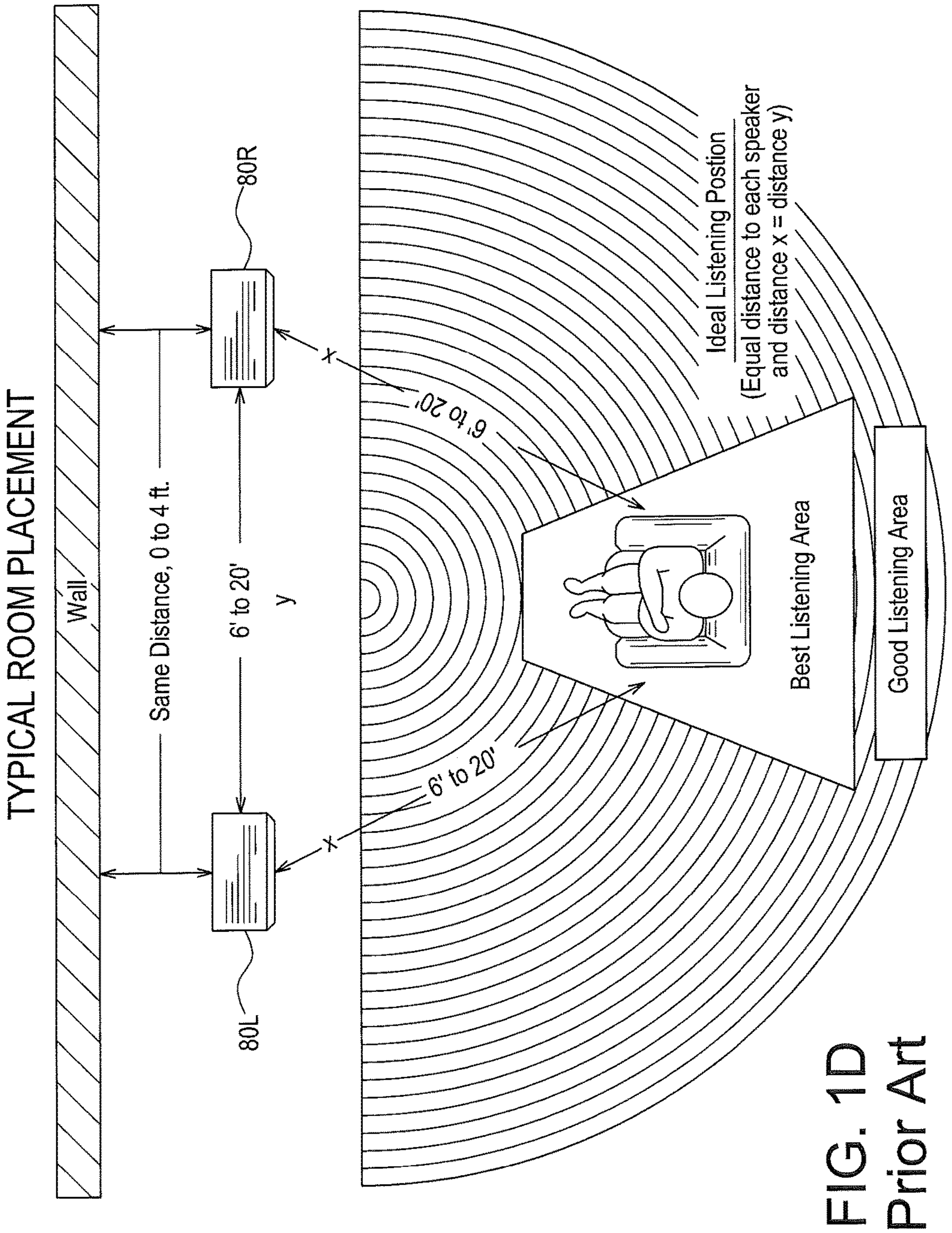
FIG. 1D Prior Art
Figure 7:
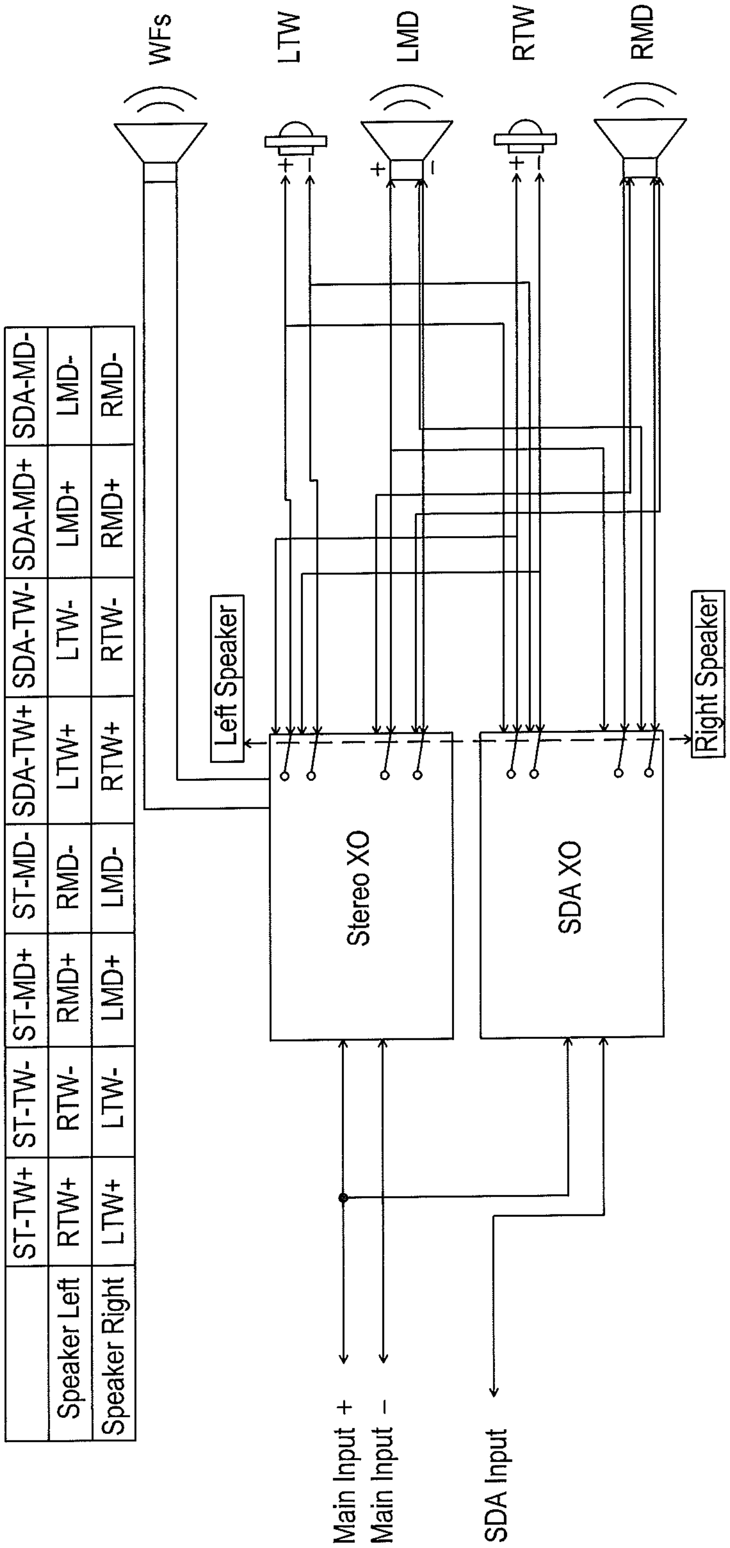
FIG. 7 is a diagram and schematic which, taken together, illustrate how the user or installer configurable multi-faceted or multi-baffle SDA loudspeaker system of FIGS. 2-6B may be set up for use as either a left main stereo speaker or a right main stereo speaker, in accordance with the structure and method of the present invention.

Turning now to FIG. 7 a user or installer configurable multi-faceted or multi-baffle SDA loudspeaker system (e.g., 100) may include a switching or multiplexing system and be set up for use as either a left main stereo SDA speaker or a right main stereo SDA speaker, in accordance with the structure and method of the present invention. This optional feature allows product manufacturers SDA compatible loudspeaker products that can be user configured to be left channel or right channel SDA speakers, but, at the time of sale have a single product or Stock Keeping Unit "SKU" identifiers. The addition of a tweeter on the crosstalk cancelling side of the new SDA loudspeaker (e.g., 100 or 280) now allows the speaker (as a product or "SKU") to be symmetrical, thereby providing an option for resolving this issue (using, e.g., the system illustrated in FIG. 7). The result is a loudspeaker system front baffle with two diverging arrays, each mounted on conjoined, preferably planar left and right side baffle segments or facets which diverge a selected angle (e.g., 15 degrees) from a transverse vertical plane defined along what, in FIG. 1A would otherwise been have been the "speaker axis". In the illustrated embodiments, the symmetrically angled conjoined intersecting left and right side baffles (e.g., 192, 194) can intersect in a forward-facing or distal edge to define left and right side angled baffle planes or facets meeting at an acute angle of, preferably 150 degrees (as seen from within the loudspeaker enclosure) or defining an outside corner of two planes which meet at an angle of 210 degrees, as seen from the listener's position, in front of the speaker(s). The baffle aiming angle described and illustrated in these embodiments as being (preferably) 15 degrees to the left and right of a central axis parallel to the listening axis, but could be rendered (effectively enough, with crossover changes) using baffles angled symmetrically back from a horizontal plane in any angle within the range of 10 degrees and 30 degrees. The angled first and second upper baffle segment arrays are then are then fed signals from a crossover (e.g., 140, 440) which is optionally configurable using switches or jumpers (as illustrated in FIG. 7) such that either (e.g., left baffle or right baffle) array can be selected by the user or installer as being (a) the main array or (b) SDA/effects array by rerouting signals through a switch or a jumper block.

Enhanced Crosstalk Cancellation Using the "Head Shadow":

Referring again to FIGS. 2A, 2B, 2C and 8B, cancellation of cross talk requires computing and accounting for the time delay (Δ) for sound travelling between speakers and the listener's ears. It is important that the dimensional SDA effect cancellation signal's acoustical energy arrive at the ear at the same time as the original stereo (e.g., "main") signal's acoustical energy, since they are "summed" at the ear. To accomplish this, the distance between main and effects arrays ("W" or "DW") must be roughly the distance between the ears, or about 6". In the development process for this invention, the sound arriving at each ear was considered as an acoustic sum where:

$$L_{ear} = L_{Main} + L_{SDA} * \Delta_1 + R_{SDA} * \frac{HRTF_{-30}}{HRTF_{+30}} * \Delta_2 \text{ And} \quad \text{(Eq. 1)}$$

$$R_{ear} = L_{Main} * \frac{HRTF_{-30}}{HRTF_{+30}} * \Delta_3 + L_{SDA} * \frac{HRTF_{-30}}{HRTF_{+30}} * \Delta_2 + R_{SDA} * \Delta_1 \quad \text{(Eq. 2)}$$

Figure 3:
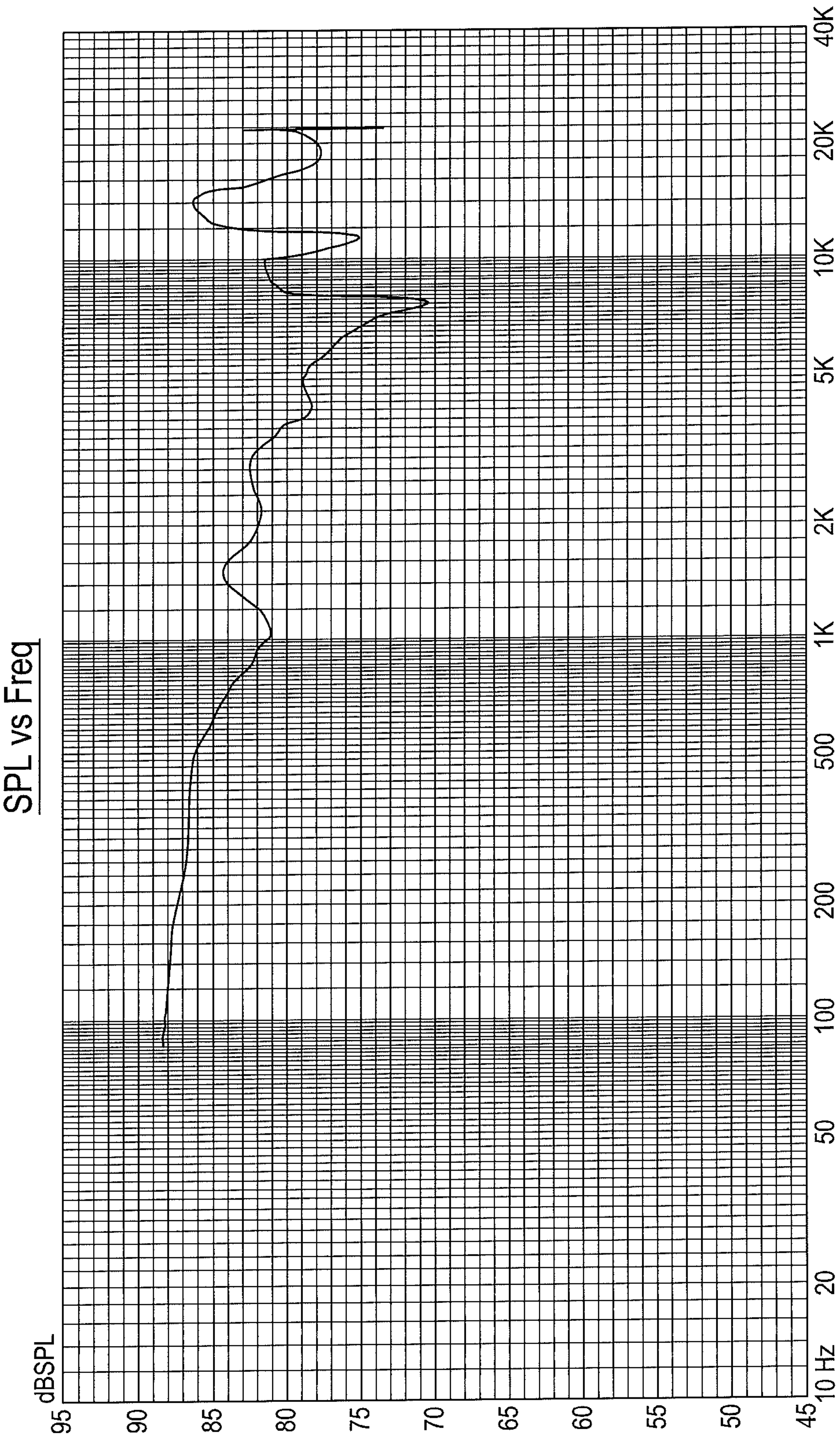
FIG. 3 illustrates an SPL v. frequency plot for an exemplary HRTF curve (or head shadow) target response curve developed as part of the present invention for a crosstalk cancelling (or dimensional SDA effect) loudspeaker, in accordance with the structure and method of the present invention.

The term ($HRTF_{-30}/HRTF_{+30}$) is the difference between the signal arriving at the near ear and signal arriving at the far ear. This is often referred to as the "Head Shadow", so in the following equations, HS=($HRTF_{-30}/HRTF_{+30}$). FIG. 3 illustrates an approximation or modelled spectral response known as the KEMAR Head Shadow (+30 vs −30 degrees) for a standard head shape and this response was used in generating the following. So, for the Right side ear:

$$R_{ear}=L_{Main}*HS*\Delta_3+L_{SDA}*HS*\Delta_2+R_{SDA}*\Delta_1 \quad \text{(Eq. 3)}$$

If one assumes there is only left signal (i.e. signal is completely panned left), then, for the right ear, there should be no signal. (so $R_{ear}=0$).

If, for example, if delay Δ3=Δ1 these two assumptions can be plugged into the equation, and upon rearranging terms, one gets:

$$-L_{main}*HS*\Delta_1=L_{SDA}*HS*\Delta_2+R_{SDA}*\Delta_1 \quad \text{(Eq. 4)}$$

Ignoring the $L_{SDA}$ term:

$$-L_{Main}*HS*\Delta_1=R_{SDA}*\Delta_1 \quad \text{(Eq. 5)}$$

And this observation lead to how a head shadow effect generating filter may be approximated. If the $R_{SDA}$ (dimensional or SDA effect crosstalk cancelling) signal can be filtered in such a way as to mimic or compensate for the head shadow, then it will more completely cancel the $L_{Main}$ signal's crosstalk. Applicant's development work has led to the discovery that this can be approximated by a simple filter and one can then effectively multiply SDA array's signal by the effect of this filter.

$$R_{ear}=L_{Main}*HS*\Delta_3+L_{SDA}*HS*HS*\Delta_2+R_{SDA}*HS*\Delta_1 \quad \text{(Eq. 6)}$$

Because it is known that $R_{SDA}=-L_{Main}$ (electrically), the expression for the filter as written in Eq. 6 can be simplified to:

$$R_{ear}=L_{SDA}*HS*HS*\Delta_2 \quad \text{(Eq. 7)}$$

So, the remainder of the acoustic summation at the right ear is the $L_{SDA}$ signal, filtered by the electrical filter and also the physical head shadow itself, plus a delay, which means cancellation of crosstalk is more effective than the prior art SDA system.

In improved SDA system 250, the SDA crosstalk cancellation effect is significantly increased by using crossover networks (e.g., 140 or 340 with Shelf filter sections in the SDA part of the crossover network) that compensate for a listener's Head Shadow, thereby making the dimensional or SDA crosstalk cancellation more effective over a broader spectrum.

Referring next to FIGS. 8A and 8B, sound reproduction system 250 having a left channel output and a right channel output includes apparatus for reproducing sound having an expanded and more stable acoustic field and acoustic image and includes a first or left loudspeaker system enclosure or tower 280L disposed in a first loudspeaker system enclosure location (FIG. 8B) spaced a selected distance (e.g., 6-20 feet) from a listening location for left channel playback, where the listening location is a place in a space for accommodating a listener's head having a right ear location and a left ear location spaced along an ear axis. System 250 preferably includes a second or right side loudspeaker system enclosure 280R which is configured for right channel playback and is wired to function as a mirror image or cooperating loudspeaker.

Figure 10:
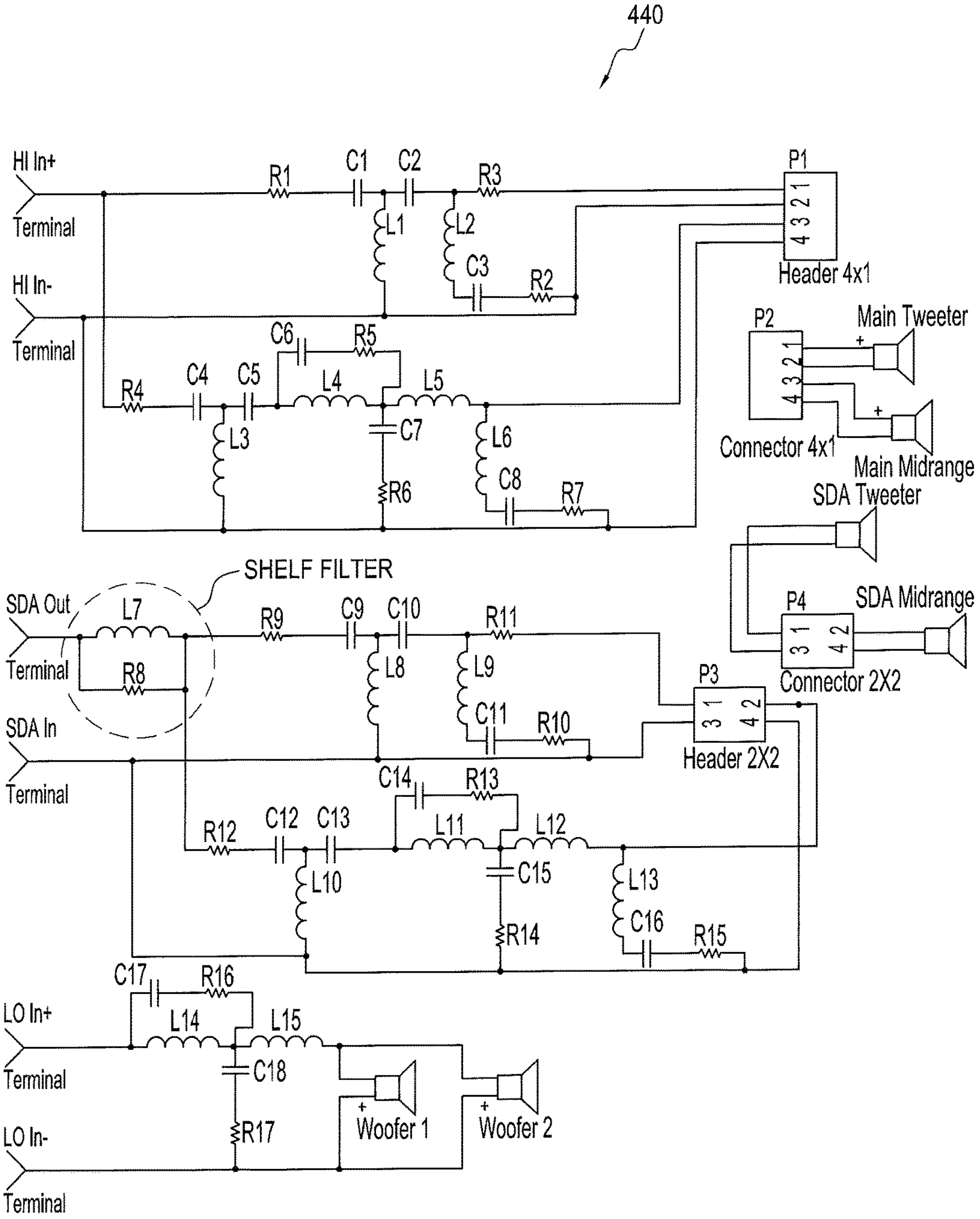
FIG. 10 illustrates a crossover circuit schematic for another embodiment of the new SDA loudspeaker system and method wherein the middle section illustrates connections for the crosstalk cancelling or dimensional SDA effect signals for the SDA tweeter and SDA midrange speakers including a "shelf" filter section which comprises the head shadow mimicking portion, in accordance with the structure and method of the present invention.

The left loudspeaker system enclosure 280L has a multi-faceted or multi-planar front baffle surface (see e.g., FIGS. 9A-9E) comprising a first front baffle surface or facet 292L which is angled rearwardly to recede at a selected (e.g., 10-30 degree, preferably 15 degree) angle from a vertical plane aligned with the speaker axis on the left side, and a second front baffle surface or facet 294L which is angled rearwardly to recede at a selected (e.g., 15 degree) angle from a vertical plane aligned with the speaker axis on the right side, where the first and second baffle surfaces 292L, 294L define loudspeaker driver supporting and aiming structures aligned along substantially vertical planes (e.g., as shown in FIGS. 9A-9E). As described above, that first baffle facet 292L carries and aims a first midrange driver 329L having a midrange driver acoustic center and a first tweeter driver 338L having a tweeter driver acoustic center which is preferably substantially vertically aligned with said first midrange driver acoustic center along a vertical axis centered within and in the vertical plane defined by facet surface 292. The second baffle facet 294 carries and aims a second midrange driver 329R and a second tweeter 338R, and that second midrange driver 329R has its acoustic center spaced laterally from the first midrange driver 329L by a selected distance DW (see, e.g. FIG. 9D, about 6-6.5 inches), and the second tweeter driver 338R has a tweeter driver acoustic center which is preferably substantially vertically aligned with the acoustic center of second midrange driver 329R and spaced laterally from the first tweeter driver's acoustic center by the same selected distance DW (e.g., about 6-6.5 inches). First loudspeaker system enclosure or tower 280L has external terminals (e.g., via input panel 316) for Main (+) and (−) signal inputs, and an SDA signal input/output terminal (as shown in FIG. 10) where signal processing circuitry including crossover circuit 440 has bi-amp or bi-wire compatible (HI and LO) input terminals for the Main (+) connection, the Main (−) connection, an SDA In connection and an SDA Out connection, where crossover 440 is configured to generate (i) a "main" tweeter signal (ii) a "main" midrange signal, (iii) a "Head Shadow Filter" compensated SDA dimensional effect tweeter signal, and a "Head Shadow Filter" compensated SDA dimensional effect midrange signal. The signal processing circuitry including crossover 440 (or crossover 140) communicates the SDA dimensional effect tweeter signal and the SDA dimensional effect midrange signal to an SDA dimensional effect radiating array (mounted on facet 292) including first tweeter 338L and first midrange 329L which are aimed by first front baffle or facet 292 away from the listening position and away from the listening axis (as shown in FIG. 8B).

Sound reproduction system 250 has signal processing circuitry (e.g., in crossover circuit 440) that communicates the Main Tweeter signal and the Main Midrange signal to the main radiating array comprising second tweeter 338R and second midrange 329R which are aimed by said second front baffle 294 toward the listening position. As shown in FIG. 8B, sound reproduction system 250 also of claim 2, further includes a second loudspeaker system enclosure or tower 280R disposed in a second loudspeaker system location which is spaced laterally from and aligned along a speaker axis with the location of first loudspeaker system 280L and the spacing between left tower 280 L and right tower 280 R is preferably in the range of 6 to 20 feet. Second tower or right side SDA speaker assembly 280R is preferably spaced from the listening location by a distance substantially equal to the spacing between the listening location and the first loudspeaker system 280L. Second loudspeaker system enclosure 280R, is physically configured as a tower enclosure assembly (e.g., 280, FIGS. 9A-9E), and differs from left or first enclosure 280L in how its crossover (e.g., 440) is connected.

Second loudspeaker system enclosure 280R also has a multi-faceted or multi-planar front baffle surface 290 comprising a first front angled baffle surface or facet 292R which is angled rearwardly to recede at a selected (e.g., 10-30 degree, preferably 15 degree) angle from a vertical plane aligned with the speaker axis on the left side, and a second front baffle surface or facet 294R which is angled rearwardly to recede at a selected (e.g., 15 degree) angle from a vertical plane aligned with the speaker axis on the right side, where the first and second baffle surfaces 292R, 294R define loudspeaker driver supporting and aiming structures aligned along substantially vertical planes.

Turning again to FIGS. 9A-9E, and specifically to FIG. 9E which provides an exploded perspective view of the tower loudspeaker enclosure 280 used in making left side enclosure 280L and 280R, it is shown that braced MDF loudspeaker cabinet 301 includes internal 18 mm MDF bracing and is supported upon base 302 which is made of 50 mm thick MDF. The cabinet's entire front baffle 290 (including facets 292 and 294) and top 303 are preferably made of 25 mm MDF. In the preferred embodiment, a pair of 5.25 inch midrange drivers 329 are positioned beside one another on the diverging adjacent baffle or facet surfaces 292, 294. The front baffle 290 is covered by and supports a detachable grill assembly 311 and in the bottom segment includes vertically aligned circular openings configured to support and aim first and second 10" woofers 304 above an aperture or port defined by port trim insert member 306. An optional removable top cover 305 allows future installation and use of up-firing (e.g., Dolby® Atmos® system) drivers. As noted above, each tower enclosure assembly 280 includes first and second tweeters 338 mounted with tweeter trim panels 312. In a bass cavity section behind and in fluid communication with the back side of woofers 304, a tuned port assembly includes port flare 313 and MDF doughnut 314 on cylindrical cardboard port tube 315.

The connections to the crossover (e.g., 140 or 440) are made through an aluminum input plate 316. Two SDA interconnect conductors (preferably bundled into an SDA interconnect cable assembly 266) are preferably made up as red and black jumper wires, one red, one black, each 12AWG, and each with a gold plated spade terminal on one end and a banana plug pin connector on the opposite end. The crossover assembly 345 is preferably a printed circuit board assembly (e.g., with conductors and circuit elements for crossover circuit 440, as shown in FIG. 10) and preferably has plastic standoffs for attachment near the bottom of the cabinet's interior volume. Crossover assembly 345 preferably has polarized Faston-style connectors on all connections. Input plate 316 carries preferably three binding post assemblies 359 for a bi-wireable "main" connection to one or more amplifiers (e.g., 54) and optionally to a source for an elevation module (e.g., Atmos) signal to drive an optional ATMOS assembly (not shown).

Turning to the crossover circuit 440 illustrated in FIG. 10, the "Main In" portion of the crossover is configured for use with a biwire or biamp setup, and so is divided into Hi and Lo sections which may be used with conductive jumpers connecting terminals shown as "HI In+" to "LO In+" and "HI In−" to "LO In−", where the terminals labeled "LO In" are connected to the woofer portion of the crossover circuit and the terminals labeled "HI In" are connected to the midrange and tweeter portions of the crossover circuit. Crossover 440 is a three-way crossover with five main sections, namely:

1) Main Tweeter—a third order high pass with level resistor and notch;

2) Main Midrange—a third order high pass, third order low pass, notch and a level resistor;

3) Woofer—a third order low pass;

4) SDA Tweeter—a third order high pass with level resistor and notch;

5) SDA Midrange—a third order high pass, third order low pass, notch and a level resistor, where 6) The SDA sections are preceded by a first order low pass shelf circuit (the paralleled circuit of L7 and R8).

The SDA Input/Output terminals are used to connect the SDA portion of the crossover to the "other" speaker in the stereo pair (e.g., 280L and 280R) and enable the improved head-shadow compensating SDA crosstalk cancellation to function as intended. An optional Elevation module input (not shown in FIG. 10, but possibly included in crossover assembly 345) connects a set of wires up to an optional elevation module which might be installed in the top of the speaker (e.g., replacing cover 305). Returning to FIG. 10, the critical passive electrical components shown in crossover 440 have selected tolerances which are typically measured at 1 kHz, and the specifics for those components are included in the Table 1:

TABLE 1

| Part | Nominal Value | Tol. | Power, Voltage or Current Rating or Wire Gauge | DCR(Inductors & Switches) DF (Capacitors) | Material |
|---|---|---|---|---|---|
| C1, C9 | 10 μF | ±5% | 100 V | ≤1% | Polyester metal film |
| C2, C10 | 30 μF | ±5% | 100 V | ≤1% | Polyester metal film |
| C3, C11 | 2.0 μF | ±5% | 100 V | ≤1% | Polyester metal film |
| C4, C5, C12, C13 | 68 μF @ 120 Hz | ±5% | 200 V | ≤5% | Electrolytic |
| C6, C14 | 1.0 μF | ±5% | 100 V | ≤1% | Polyester metal film |
| C7, C15 | 18 μF | ±5% | 100 V | ≤1% | Polyester metal film |
| C8, C16 | 30 μF | ±5% | 100 V | ≤5% | Electrolytic |
| C17 | 4.7 μF | ±5% | 100 V | ≤5% | Electrolytic |
| C18 | 82 μF | ±5% | 100 V | ≤5% | Electrolytic |
| L1, L8 | 0.3 mH | ±5% | 1.0 mm | ≤0.25 Ω | Air Core; copper wire |
| L2, L9 | 1.0 mH | ±5% | 0.5 mm | ≤2.0 Ω | Air Core; copper wire |
| L3, L10 | 2.0 mH | ±5% | 1.0 mm | ≤0.25 Ω | Steel laminate I-Core; copper wire on plastic bobbin |
| L4, L11 | 1.0 mH | ±5% | 1.0 mm | ≤0.15 Ω | Steel laminate U-Core (min 9.5 mm square); copper wire on plastic bobbin |
| L5, L12 | 0.5 mH | ±5% | 1.0 mm | ≤0.1 Ω | Steel laminate U-Core (min 9.5 mm square); copper wire on plastic bobbin |
| L6, L13 | 3.0 mH | ±5% | 0.8 mm | ≤0.6 Ω | Steel laminate I-Core; copper wire on plastic bobbin |
| L7 | 1.2 mH | ±5% | 1.0 mm | ≤0.2 Ω | Steel laminate U-Core (min 9.5 mm square); copper wire on plastic |

TABLE 1-continued

| Part | Nominal Value | Tol. | Power, Voltage or Current Rating or Wire Gauge | DCR(Inductors & Switches) DF (Capacitors) | Material |
|---|---|---|---|---|---|
| | | | | | bobbin |
| L14 | 3.0 mH @ 120 Hz | ±5% | 1.2 mm | ≤0.2 Ω | Steel laminate I-Core; copper wire on plastic bobbin |
| L15 | 2.0 mH @ 120 Hz | ±5% | 1.2 mm | ≤0.15 Ω | Steel laminate I-Core; copper wire on plastic bobbin |
| R5, R13 | 15 Ω | ±5% | 5 W | | Sand Cast |
| R6, R14 | 1.0 Ω | ±5% | 5 W | | Sand Cast |
| R7, R15 | 4.0 Ω | ±5% | 10 W | | Sand Cast |
| R8 | 8.0 Ω | ±5% | 10 W | | Sand Cast |
| R16 | 15 Ω | ±5% | 5 W | | Sand Cast |
| R17 | 1.0 Ω | ±5% | 10 W | | Sand Cast |

Referring again to FIGS. 9A and 10, the connections to drivers made in a specific enclosure (e.g. 280R) render that enclosure either a Left channel tower or a Right channel tower. So for a Right channel tower (e.g. 280R), the "main array" connections for the driver array on left facet surface 292R are made (a) from connector P2, terminals 3 (+) and 4 to the midrange driver 329L on upper left baffle segment 292 and (b) from connector P2, terminals 1 (+) and 2 to the tweeter driver also on upper left baffle segment 292; following this method, the "SDA" or dimensional array connections are made (a) from connector 2X2, terminals 2 and 4 to the midrange driver 329R on upper right baffle segment 294 and (b) from connector 2X2, terminals 1 and 3 to the tweeter driver 338R also on upper right baffle segment 294.

The system 250 and method of the present invention provide specific improvements on this applicants' prior work on the well-known SDA™ speaker systems, and persons of skill in the art will appreciate that those improvements include a new and more effective SDA effect generating apparatus in system 250 with a left speaker (e.g., 329R) in enclosure 280L which is aimed (e.g., by facet 294L) toward the listening position at a selected main driver aiming angle (diverging from a "straight ahead" line parallel to the listening axis, where the selected main driver aiming angle is between 10 degrees and 30 degrees (e.g., 15 degrees) and where the left sub or SDA effect generating speaker(s) (e.g., 329L and 338L) are aimed away from the listening position at a selected symmetrical mirror-image diverging sub/SDA effect driver aiming angle to that straight ahead reference line which is parallel to the listening axis, where the sub/SDA effect driver aiming angle is substantially equal in magnitude to the main driver aiming angle (best seen in FIGS. 8B, 9C and 9D).

Another improvement in selected embodiments of new and improved SDA loudspeaker system (e.g., 250) is that a left main speaker may comprise a left main midrange driver which is vertically aligned with a left main tweeter (e.g., on angled baffle surface 292R) to provide a left main driver array aimed toward the listening position at a selected left main driver array aiming angle from a line parallel to the listening axis (as seen in FIGS. 8B and 9C), where that selected left main driver array aiming angle is between 10 degrees and 30 degrees (e.g., 15 degrees) and where the left sub or SDA effects speaker includes a left sub midrange driver 329R which is vertically aligned with a left sub tweeter to provide a left sub driver array aimed (e.g., by facet 294R away from the listening position at a selected left sub driver array aiming angle, diverging from that imaginary "straight ahead" line parallel to the listening axis which is substantially equal in magnitude to the main driver aiming angle (as best seen in FIG. 9C).

Yet another improvement in selected embodiments of new and improved SDA loudspeaker system (e.g., 250) is that the SDA jumper connection 266 connecting the crossovers in each of the speakers (e.g., 280L, 280R) provides a connection to the right and left channel outputs for developing a left channel minus right channel signal and a right channel minus left channel signal which now includes signal processing circuitry included in each crossover (e.g., 140, 440) with input terminals for a Main (+) connection, a main (−) connection, an SDA In connection and an SDA Out connection, where that crossover (e.g., 140 or 440) is configured to generate (i) a "main" tweeter signal (ii) a "main" midrange signal, (iii) a "Head Shadow Filter" compensated SDA dimensional effect tweeter signal, and a "Head Shadow Filter" compensated SDA dimensional effect midrange signal. In addition, the left sub (or SDA effect) speaker now comprises an array with an effects generating (or sub) tweeter driver which is spaced from and vertically aligned with a sub midrange driver, so that the "Head Shadow Filter" compensated SDA dimensional effect tweeter signal is communicated with the SDA effect generating (or sub) tweeter.

The improved method of operating and using system 250 of the present invention comprises the steps of: disposing a right main speaker (e.g., on baffle segment 292R) and a left main speaker (e.g., on baffle segment 294L) at right and left main speaker locations equidistantly spaced from the listening location which, as seen in FIG. 8B is a place in space for accommodating a listener's head facing the main speakers and having a right ear location and a left ear location along an ear axis, with the right and left ear locations separated along the ear axis by a maximum interaural sound distance of Δtmax, and the listening location being defined as the point on the ear axis equidistant to the right and left ears, the listening location being spaced from the main speakers and defining a listening angle with respect thereto to result in an interaural time delay Δt of the right and left ear locations along the listening angle to the left and right main speakers; the next step is disposing at least one right sub-speaker (e.g., on baffle segment 294R) and at least one left sub-speaker (e.g., on baffle segment 292L) at right and left sub-speaker locations equidistantly spaced from the listening location; the next step is selecting the right and left sub-speaker locations such that the inter-speaker delay of the right sub-speaker over the right main speaker with respect to the right ear location and the inter-speaker delay of the left sub-speaker over the left main speaker with respect to the left ear location are each approximately the same as the interaural time delay Δt; and then coupling the right and left channel outputs to the right and left main speakers, respectively (via crossovers 140 or 440 and SDA cable 266); next, using crossover 140 or 440, deriving from the right and left channel outputs an inverted right channel signal and an inverted left channel signal for use in generating the cross talk cancellation effect; and coupling the inverted right channel signal to the at least one left sub-speaker and coupling the inverted left channel signal to the at least one right sub-speaker. Here, we note that the Improved Method of the present invention also comprises deriving a head shadow compensated inverted right channel signal and a head shadow compensated inverted left channel signal and coupling the head shadow compensated inverted right channel signal to the at least one left sub-speaker (e.g., on baffle segment 292L) and coupling the head shadow compensated inverted left channel signal to the at least one right sub-speaker (e.g., on baffle segment 294R). This improved method also includes selecting main speaker locations and sub-speaker locations to be on non-parallel baffle segments (e.g., on baffle segments 292L and 292R) aiming at least one left or right sub-speaker away from a speaker axis which is parallel to the ear axis. Optionally, the method may include high pass filtering the inverted right and left channel signals prior to applying them to the at least one left and at least one right sub-speakers, respectively.

Having described preferred embodiments of a new and improved loudspeaker system (e.g., 250) and SDA signal processing method, it is believed that other modifications, variations and changes will be suggested to those skilled in the art in view of the teachings set forth herein. It is therefore to be understood that all such variations, modifications and changes are believed to fall within the scope of the present invention as set forth in the following claims.

We claim:

1. A sound reproduction system having a left channel output and a right channel output, apparatus for reproducing sound having an expanded and stable acoustic field and acoustic image, comprising:

(a) a first loudspeaker system enclosure or tower disposed in a first loudspeaker system enclosure location along a speaker axis spaced from a listening location, the listening location being a place in a space for accommodating a listener's head having a right ear location and a left ear location spaced along an ear axis, said first loudspeaker system enclosure having a multi-faceted or multi-planar front baffle surface comprising a first front baffle surface or facet which is angled rearwardly to recede at a selected angle in the range of 10 to 30 degrees from a vertical plane aligned with the speaker axis on the left side, and a second front baffle surface or facet which is angled rearwardly to recede at a selected angle in the range of 10 to 30 degrees from a vertical plane aligned with the speaker axis on the right side, where the first and second baffle surfaces define loudspeaker driver supporting and aiming structures aligned along substantially vertical planes;

(b) wherein the first baffle surface or facet carries and aims a first midrange driver having a midrange driver acoustic center and a first tweeter driver having a tweeter driver acoustic center which is substantially vertically aligned with said first midrange driver acoustic center;

(c) wherein the second baffle facet carries and aims a second midrange driver and a second tweeter driver, wherein said second midrange driver has its acoustic center spaced laterally from said first midrange driver by a selected distance DW in the range of 6 to 6.5 inches, and wherein said second tweeter driver has a tweeter driver acoustic center which is substantially vertically aligned with said second midrange driver acoustic center and spaced laterally from said first tweeter driver by said selected distance DW in the range of 6 to 6.5 inches;

(d) said first loudspeaker system enclosure or tower having external terminals for Main (+) connection and main (−) connection signal inputs, and a Stereo Dimensional Array signal input terminal and a Stereo Dimensional Array signal output terminal; and (e) said first enclosure signal processing circuitry including a crossover with input terminals for said Main (+) connection, said main (−) connection, said Stereo Dimensional Array signal input terminal and said Stereo Dimensional Array signal output terminal, wherein said crossover is configured to generate (i) a "main" tweeter signal (ii) a "main" midrange signal, (iii) a "Head Shadow Filter" compensated Stereo Dimensional Array dimensional effect tweeter signal, and a "Head Shadow Filter" compensated Stereo Dimensional Array dimensional effect midrange signal; and (f) wherein said signal processing circuitry communicates said Stereo Dimensional Array dimensional effect tweeter signal and said Stereo Dimensional Array dimensional effect midrange signal to a Stereo Dimensional Array dimensional effect radiating array including said first tweeter driver and said first midrange driver which are aimed by said first front baffle surface or facet away from the listening position.

2. The sound reproduction system of claim 1, wherein said signal processing circuitry communicates said main tweeter signal and said main midrange signal to a main radiating array comprising said second tweeter driver and said second midrange driver which are aimed by said second front baffle surface or facet toward the listening position.

3. The sound reproduction system of claim 2, further including:

(g) a second loudspeaker system enclosure or tower disposed in a second loudspeaker system location which is spaced from and aligned along a speaker axis with said first loudspeaker system location and spaced from said listening location, said second loudspeaker system enclosure having a multi-faceted or multi-planar front baffle surface comprising a first front baffle surface or facet which is angled rearwardly to recede at a selected angle in the range of 10 to 30 degrees from a vertical plane aligned with the speaker axis on the left side, and a second front baffle surface or facet which is angled rearwardly to recede at a selected angle in the range of 10 to 30 degrees from a vertical plane aligned with the speaker axis on the right side, where the first and second baffle surfaces define loudspeaker driver supporting and aiming structures aligned along substantially vertical planes;

(h) wherein the second enclosure first baffle surface or facet carries and aims a first midrange driver having a midrange driver acoustic center and a first tweeter driver having a tweeter driver acoustic center which is preferably substantially vertically aligned with said first midrange driver acoustic center;

(i) wherein the second enclosure second baffle surface or facet carries and aims a second midrange driver and a second tweeter driver, wherein said second midrange driver has its acoustic center spaced laterally from said first midrange driver by a selected distance DW in the range of 6 to 6.5 inches, and wherein said second tweeter driver has a tweeter driver acoustic center which is preferably substantially vertically aligned with said second midrange driver acoustic center and spaced laterally from said first tweeter driver by said selected distance DW in the range of 6 to 6.5 inches;

(j) said second loudspeaker system enclosure or tower having external terminals for Main (+) connection and main (−) connection; signal inputs, a Stereo Dimensional Array signal input terminal and a Stereo Dimensional Array signal output terminal;

(k) second enclosure signal processing circuitry including a second enclosure crossover with input terminals for said Main (+) connection, said main (−) connection, said Stereo Dimensional Array signal input terminal and said Stereo Dimensional Array signal output terminal, wherein said second enclosure crossover is configured to generate (i) a second "main" tweeter signal (ii) a second "main" midrange signal, (iii) a second "Head Shadow Filter" compensated Stereo Dimensional Array dimensional effect tweeter signal, and a second "Head Shadow Filter" compensated Stereo Dimensional Array dimensional effect midrange signal; and (l) wherein said second enclosure signal processing circuitry communicates said second Stereo Dimensional Array dimensional effect tweeter signal and said second Stereo Dimensional Array dimensional effect midrange signal to a second Stereo Dimensional Array dimensional effect radiating array including said second enclosure second tweeter driver and said second enclosure second midrange driver which are aimed by said second enclosure second front baffle away from the listening position.

4. The sound reproduction system of claim 3, wherein said second enclosure signal processing circuitry communicates said second main tweeter signal and said second main midrange signal to a second main radiating array comprising said second enclosure first tweeter driver and said second enclosure first midrange driver which are aimed by said second enclosure first front baffle surface or facet toward the listening position.

5. The sound reproduction system of claim 1, further including:

a user or installer selectable signal connection configurable to make said first loudspeaker system enclosure function as either a left-side enhanced SDA speaker system or a right-side enhanced SDA speaker system, wherein said user or installer selectable signal connection comprises a single-throw multi-pole switch or a tether connection system.

6. In a stereophonic sound reproduction system having a left channel output and a right channel output, an improved apparatus for reproducing sound having a realistic ambient field and a larger, more stable acoustic image, comprising:

a right main speaker and a left main speaker disposed respectively at right and left main speaker locations spaced apart along a speaker axis, with a listening location located generally along a listening axis perpendicular to the speaker axis and intersecting the speaker axis at a point midway between the right and left main speaker locations;

means coupling the right and left channel outputs, respectively, to said right and left main speakers;

a right sub-speaker positioned on the speaker axis at a right sub-speaker location spaced a predetermined distance from the right main speaker location and further from the listening axis than said right main speaker location;

a left sub-speaker positioned on the speaker axis at a left sub-speaker location spaced a predetermined distance from the right main speaker location and further from the listening axis than said left main speaker location;

means connected to the right and left channel outputs for developing a left channel minus right channel signal and a right channel minus left channel signal;

means coupling said left channel minus right channel signal to said left sub-speaker and said right channel minus left channel signal to said right sub-speaker;

whereby sound reproduced by said apparatus as perceived by a listener located generally along the listening axis has a realistic acoustic field and enhanced acoustic image; the improvement comprising:

said left main speaker is aimed toward the listening position at a selected main driver aiming angle from a line parallel to said listening axis, said selected main driver aiming angle being between 10 degrees and 30 degrees and wherein said left sub speaker is aimed away from the listening position at a selected sub driver aiming angle from a line parallel to said listening axis which is substantially equal in magnitude to said main driver aiming angle.

7. The improved apparatus for reproducing sound having a realistic ambient field and a larger, more stable acoustic image of claim 6, wherein said left main speaker is aimed toward the listening position at a selected main driver aiming angle from a line parallel to said listening axis, said selected main driver aiming angle being 15 degrees and wherein said left sub speaker is aimed away from the listening position at a selected sub driver aiming angle from a line parallel to said listening axis which is 15 degrees away from the listener's position and said line parallel to said listening axis.

8. In a stereophonic sound reproduction system having a left channel output and a right channel output, an improved apparatus for reproducing sound having a realistic ambient field and a larger, more stable acoustic image, comprising:

a right main speaker and a left main speaker disposed respectively at right and left main speaker locations spaced apart along a speaker axis, with a listening location located generally along a listening axis perpendicular to the speaker axis and intersecting the speaker axis at a point midway between the right and left main speaker locations;

means coupling the right and left channel outputs, respectively, to said right and left main speakers;

a right sub-speaker positioned on the speaker axis at a right sub-speaker location spaced a predetermined distance from the right main speaker location and further from the listening axis than said right main speaker location;

a left sub-speaker positioned on the speaker axis at a left sub-speaker location spaced a predetermined distance from the right main speaker location and further from the listening axis than said left main speaker location;

means connected to the right and left channel outputs for developing a left channel minus right channel signal and a right channel minus left channel signal;

means coupling said left channel minus right channel signal to said left sub-speaker and said right channel minus left channel signal to said right sub-speaker;

whereby sound reproduced by said apparatus as perceived by a listener located generally along the listening axis has a realistic acoustic field and enhanced acoustic image; the improvement comprising:

said left main speaker is a left main midrange driver which is vertically aligned with a left main tweeter to provide a left main driver array aimed toward the listening position at a selected left main driver array aiming angle from a line parallel to said listening axis, said selected left main driver array aiming angle being between 10 degrees and 30 degrees and wherein said left sub speaker is a left sub midrange driver which is vertically aligned with a left sub tweeter to provide a left sub driver array aimed away from the listening position at a selected left sub driver array aiming angle from a line parallel to said listening axis which is substantially equal in magnitude to said main driver aiming angle.

9. The improved apparatus for reproducing sound having a realistic ambient field and a larger, more stable acoustic image of claim 8, wherein said left main driver array is aimed toward the listening position at a selected main driver aiming angle from a line parallel to said listening axis, said selected main driver aiming angle being 15 degrees and wherein said left sub driver array is aimed away from the listening position at a selected sub driver aiming angle from a line parallel to said listening axis which is 15 degrees away from the listener's position and said line parallel to said listening axis.

10. In a stereophonic sound reproduction system having a left channel output and a right channel output, an improved apparatus for reproducing sound having a realistic ambient field and a larger, more stable acoustic image, comprising:

a right main speaker and a left main speaker disposed respectively at right and left main speaker locations spaced apart along a speaker axis, with a listening location located generally along a listening axis perpendicular to the speaker axis and intersecting the speaker axis at a point midway between the right and left main speaker locations;

means coupling the right and left channel outputs, respectively, to said right and left main speakers;

a right sub-speaker positioned on the speaker axis at a right sub-speaker location spaced a predetermined distance from the right main speaker location and further from the listening axis than said right main speaker location;

a left sub-speaker positioned on the speaker axis at a left sub-speaker location spaced a predetermined distance from the right main speaker location and further from the listening axis than said left main speaker location;

means connected to the right and left channel outputs for developing a left channel minus right channel signal and a right channel minus left channel signal;

means coupling said left channel minus right channel signal to said left sub-speaker and said right channel minus left channel signal to said right sub-speaker;

whereby sound reproduced by said apparatus as perceived by a listener located generally along the listening axis has a realistic acoustic field and enhanced acoustic image; the improvement comprising:

said means connected to the right and left channel outputs for developing a left channel minus right channel signal and a right channel minus left channel signal including signal processing circuitry including a crossover with input terminals for a Main (+) connection, a main (−) connection, a Stereo Dimensional Array In connection and a Stereo Dimensional Array Out connection, wherein said crossover is configured to generate (i) a "main" tweeter signal (ii) a "main" midrange signal, (iii) a "Head Shadow Filter" compensated Stereo Dimensional Array dimensional effect tweeter signal, and a "Head Shadow Filter" compensated Stereo Dimensional Array dimensional effect midrange signal, and wherein said left sub speaker comprises an array with a sub tweeter driver which is spaced from and vertically aligned with a sub midrange driver, wherein said "Head Shadow Filter" compensated Stereo Dimensional Array dimensional effect tweeter signal is communicated with said sub tweeter driver.

11. The improved apparatus for reproducing sound having a realistic ambient field and a larger, more stable acoustic image of claim 10, wherein said left main speaker includes a left main driver array which is aimed toward the listening position at a selected main driver aiming angle from a line parallel to said listening axis, said selected main driver aiming angle in the range of 10 to 30 degrees and wherein said left sub driver array is aimed away from the listening position at a selected sub driver aiming angle from a line parallel to said listening axis which is in the range of 10 to 30 degrees away from the listener's position and said line parallel to said listening axis.

12. The improved apparatus for reproducing sound having a realistic ambient field and a larger, more stable acoustic image of claim 10, wherein said Head Shadow Filter comprises an inductance in parallel with a resistance to provide a shelf filter.

13. An improved method for reproducing sound from a nonbinaural recorded stereophonic source having a left channel output and a right channel output in which the reproduced sound has an expanded acoustic image comprising the steps of:

disposing a right main speaker and a left main speaker at right and left main speaker locations equidistantly spaced from a listening location, the listening location being a place in space for accommodating a listener's head facing the main speakers and having a right ear location and a left ear location along an ear axis, with the right and left ear locations separated along the ear axis by a maximum interaural sound distance of $\Delta tmax$, and the listening location being defined as the point on the ear axis equidistant to the right and left ears, the listening location being spaced from the main speakers and defining a listening angle with respect thereto to result in an interaural time delay $\Delta t$ of the right and left ear locations along the listening angle to the left and right main speakers;

disposing at least one right sub-speaker and at least one left sub-speaker at right and left sub-speaker locations equidistantly spaced from the listening location;

selecting the right and left sub-speaker locations such that the inter-speaker delay of the right sub-speaker over the right main speaker with respect to the right ear location and the inter-speaker delay of the left sub-speaker over the left main speaker with respect to the left ear location are each approximately the same as the interaural time delay $\Delta t$;

coupling the right and left channel outputs to the right and left main speakers, respectively;

deriving from the right and left channel outputs an inverted right channel signal and an inverted left channel signal; and coupling the inverted right channel signal to the at least one left sub-speaker and coupling the inverted left channel signal to the at least one right sub-speaker; the improvement comprising:

deriving a head shadow compensated inverted right channel signal and a head shadow compensated inverted left channel signal and coupling the head shadow compensated inverted right channel signal to the at least one left sub-speaker and coupling the head shadow compensated inverted left channel signal to the at least one right sub-speaker.

14. The improved method in accordance with claim 13 wherein the main speaker locations and sub-speaker locations are selected to be on non-parallel baffle segments aiming at least one right sub-speaker away from a speaker axis which is parallel to the ear axis.

15. The improved method in accordance with claim 13 including the step of high pass filtering the inverted right and left channel signals prior to applying them to the at least one left and at least one right sub-speakers, respectively.

* * * * *